United States Patent
Socha

(10) Patent No.: US 10,657,641 B2
(45) Date of Patent: May 19, 2020

(54) SOURCE AND MASK OPTIMIZATION BY CHANGING INTENSITY AND SHAPE OF THE ILLUMINATION SOURCE AND MAGNITUDE AND PHASE OF MASK DIFFRACTION ORDERS

(71) Applicant: ASML Netherlands B.V., Veldhoven (NL)

(72) Inventor: Robert Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 778 days.

(21) Appl. No.: 14/281,539

(22) Filed: May 19, 2014

(65) Prior Publication Data

US 2014/0247975 A1 Sep. 4, 2014

Related U.S. Application Data

(60) Continuation of application No. 12/962,522, filed on Dec. 7, 2010, now Pat. No. 8,730,452, which is a
(Continued)

(51) Int. Cl.
*G03B 27/52* (2006.01)
*G06T 7/00* (2017.01)
*G03F 7/20* (2006.01)

(52) U.S. Cl.
CPC .............. *G06T 7/001* (2013.01); *G03F 7/705* (2013.01); *G03F 7/70091* (2013.01);
(Continued)

(58) Field of Classification Search
CPC . G06T 7/001; G03F 7/70091; G03F 7/70125; G03F 7/70425; G03F 7/70433; G03F 7/705
See application file for complete search history.

(56) References Cited

U.S. PATENT DOCUMENTS 5,300,786 A 4/1994 Brunner et al.
5,465,220 A 11/1995 Haruki et al.
(Continued)

FOREIGN PATENT DOCUMENTS

CN 1262459 8/2000
CN 1281254 10/2001
(Continued)

OTHER PUBLICATIONS

Search Report dated Apr. 27, 2010 in SG200804656-7.
(Continued)

*Primary Examiner* — Peter B Kim
(74) *Attorney, Agent, or Firm* — Pillsbury Winthrop Shaw & Pittman LLP

(57) ABSTRACT

An illumination source is optimized by changing the intensity and shape of the illumination source to form an image in the image plane that maximizes the minimum ILS at user selected fragmentation points while forcing the intensity at the fragmentation points to be within a small intensity range. An optimum mask may be determined by changing the magnitude and phase of the diffraction orders to form an image in the image plane that maximizes the minimum ILS at user selected fragmentation points while forcing the intensity at the fragmentation points to be within a small intensity range. Primitive rectangles having a size set to a minimum feature size of a mask maker are assigned to the located minimum and maximum transmission areas ad centered at a desired location. The edges of the primitive rectangle are varied to match optimal diffraction orders O(m,n). The optimal CPL mask $O_{CPL}(x,y)$ is then formed.

23 Claims, 31 Drawing Sheets

Related U.S. Application Data division of application No. 12/186,410, filed on Aug. 5, 2008, now Pat. No. 7,864,301, which is a division of application No. 10/813,626, filed on Mar. 31, 2004, now abandoned.

(60) Provisional application No. 60/458,365, filed on Mar. 31, 2003.

(52) U.S. Cl.
CPC ...... *G03F 7/70125* (2013.01); *G03F 7/70425* (2013.01); *G03F 7/70433* (2013.01)

(56) References Cited

U.S. PATENT DOCUMENTS

| | | | |
|---|---|---|---|
| 5,607,821 | A | 3/1997 | Haruki et al. |
| 5,680,588 | A | 10/1997 | Gortych et al. |
| 5,698,347 | A | 12/1997 | Bae |
| 5,805,290 | A | 9/1998 | Ausschnitt et al. |
| 5,965,309 | A | 10/1999 | Ausschnitt et al. |
| 5,969,441 | A | 10/1999 | Loopstra et al. |
| 6,033,814 | A | 3/2000 | Burdorf et al. |
| 6,046,792 | A | 4/2000 | Van Der Werf et al. |
| 6,067,375 | A | 5/2000 | Tsudaka |
| 6,128,067 | A | 10/2000 | Hashimoto |
| 6,738,859 | B2 | 5/2004 | Liebchen |
| 6,839,125 | B2 | 1/2005 | Hansen |
| 6,871,337 | B2 | 3/2005 | Socha |
| 2002/0140920 | A1 | 10/2002 | Rosenbluth et al. |
| 2002/0152452 | A1* | 10/2002 | Socha ............... G03F 1/36 716/54 |
| 2002/0167675 | A1 | 11/2002 | Inoue et al. |
| 2003/0063394 | A1* | 4/2003 | Suzuki ............... G02B 13/143 359/649 |
| 2004/0156029 | A1 | 8/2004 | Hansen |

FOREIGN PATENT DOCUMENTS

| | | |
|---|---|---|
| CN | 1384530 | 12/2002 |
| EP | 573281 | 12/1993 |
| EP | 1202119 | 5/2002 |
| EP | 1239331 | 9/2002 |
| JP | 05-335213 | 12/1993 |
| JP | 2000-232057 | 8/2000 |
| JP | 2002-261004 | 1/2002 |
| JP | 2002-334836 | 2/2002 |
| WO | 98/40791 | 9/1998 |

OTHER PUBLICATIONS

Erdmann, et al., "Towards Automatic Mask and Source Optimization for Optical Lithography," Proc. of the SPIE Int'l Soc. for Optical Eng. SPIE, vol. 5377, No. 1, Feb. 1, 2004, pp. 646-657.

Rosenbluth, et al., "Optimum Mask and Source Patterns to Print a Given Shape," Proc. of the SPIE Int'l Soc. for Optical Eng. SPIE, vol. 4346, 2001, pp. 486-502.

European Search Report dated Aug. 28, 2008 in corresponding European application.

Dusa et al., "Study of Mask Aerial Images to Predict CD Proximity and Line End Shortening of Resist Patters," Proceedings of SPIE, 4349:148-159 (2001).

Kachwala, et al., "Imaging Contrast Improvement for 160nm Line Features Using Sub Resolution Assist Features with Binary, 6% Ternary Attenuated Phase Shift Mask with Process Tuned Resist," SPIE, 3679:55-67 (1999).

Lin, "The Exposure-Defocus Forest," Jpn. J. Appl. Phys., 33:6756-6764 (1994).

Mathur et al., "Quantitative Evaluation of Shape of Image on Photoresist of Square Apertures," IEEE Transactions on Electron Devices, 35(3):294-297 (1988).

Progler et al., "Merit Functions for Lithographic Lens Design," J. Vac. Sci. Technol. B, 14 (6):3714-3718 (1996).

Austrian Office Action issued in Austrian Patent Application No. AT 200401734-9, dated Dec. 20, 2007.

* cited by examiner

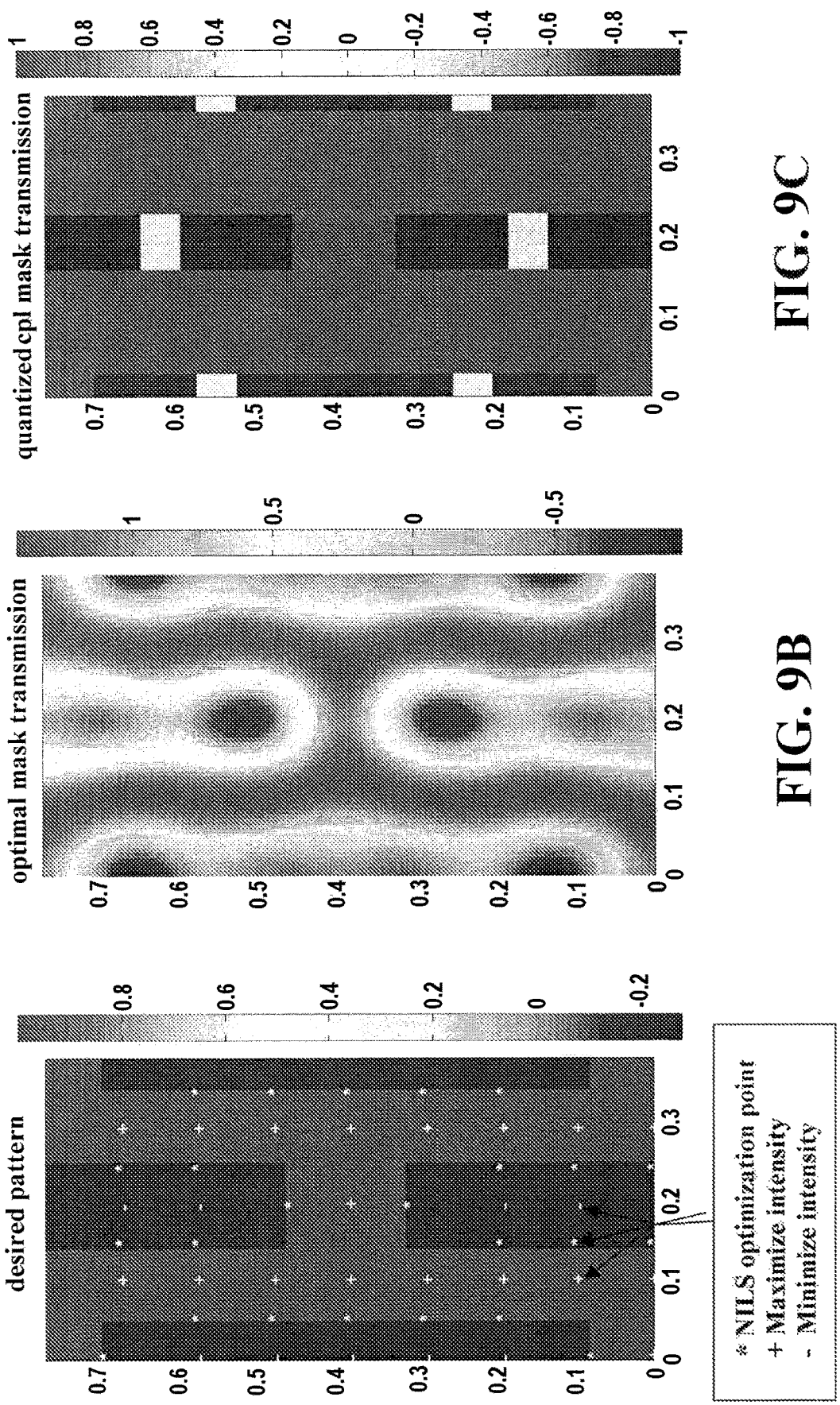

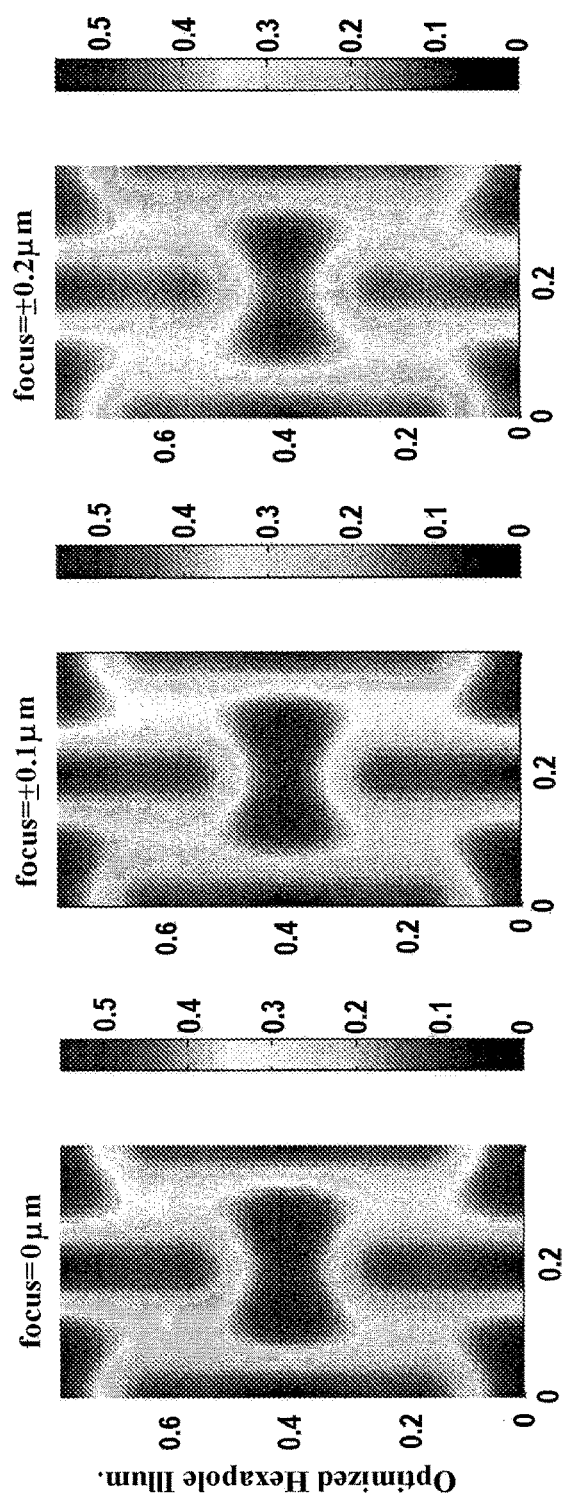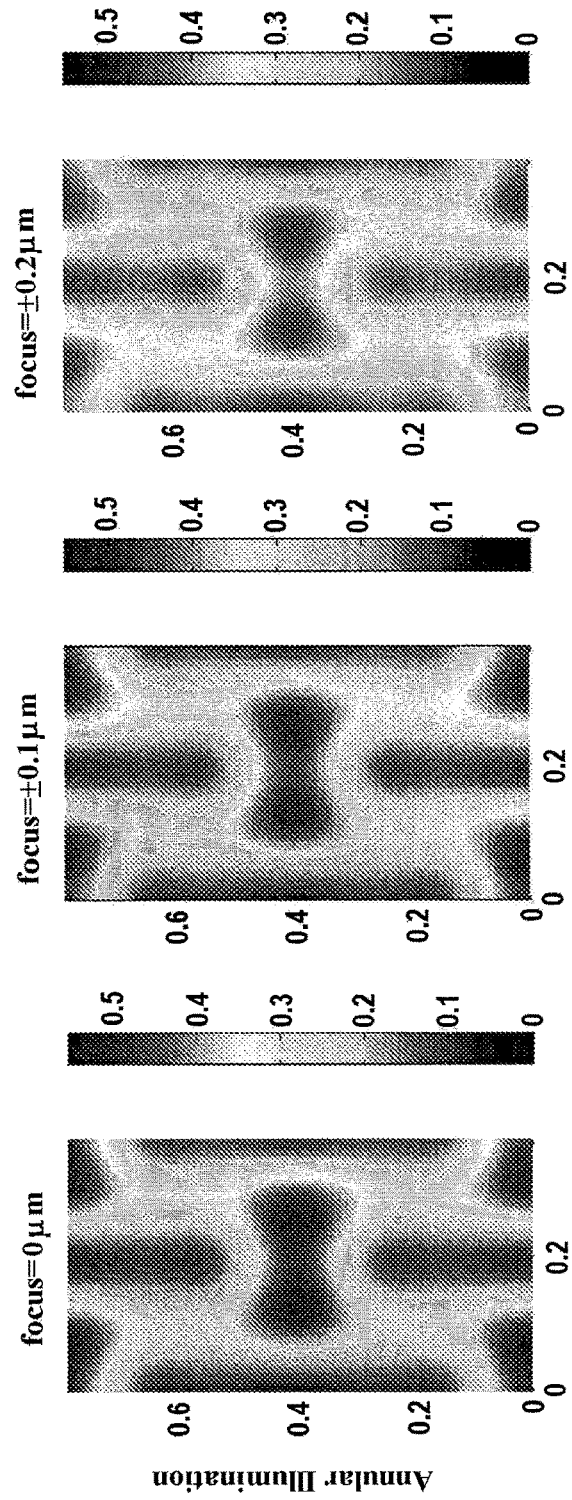
FIG. 11A
FIG. 11B

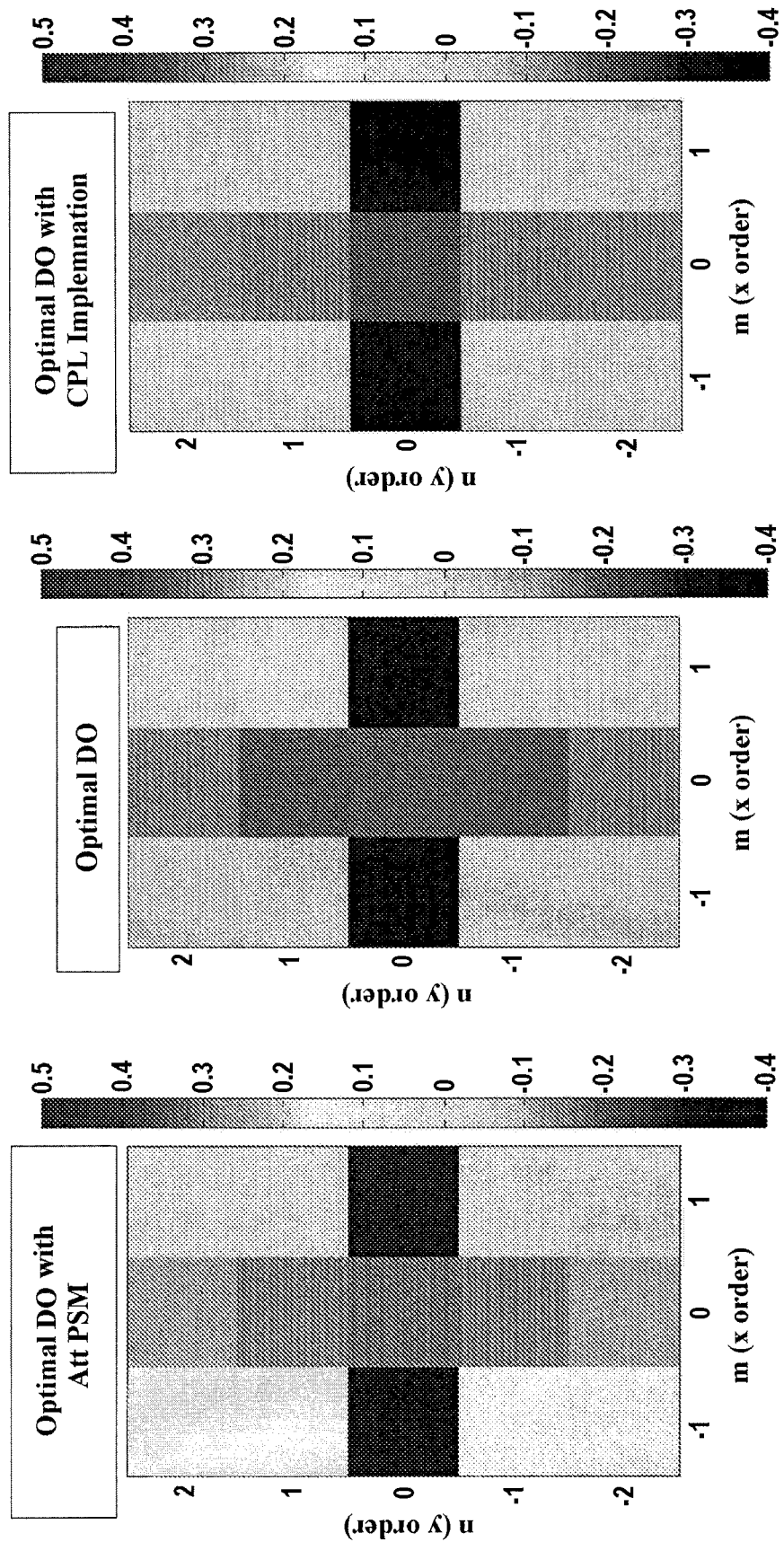

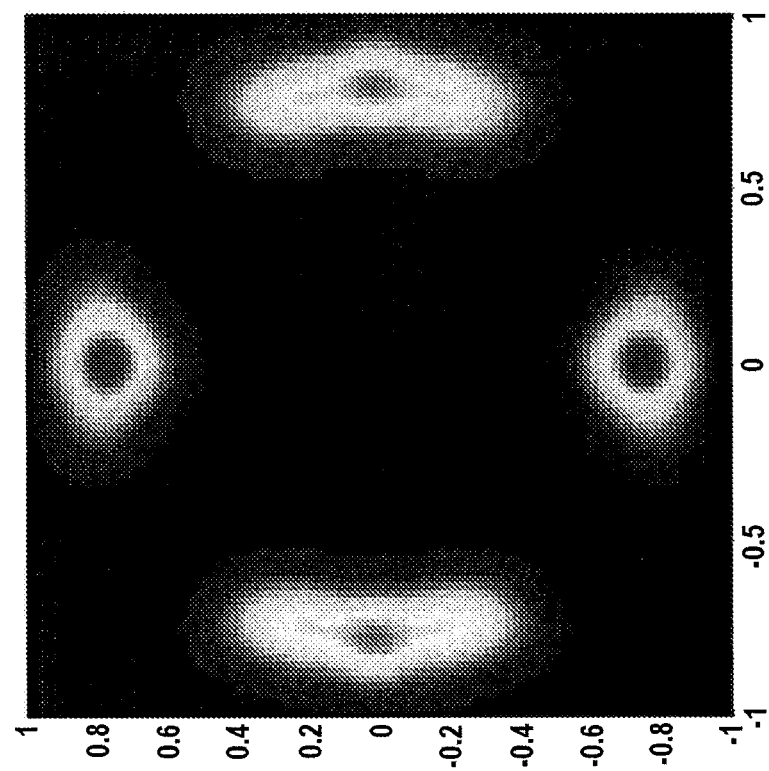
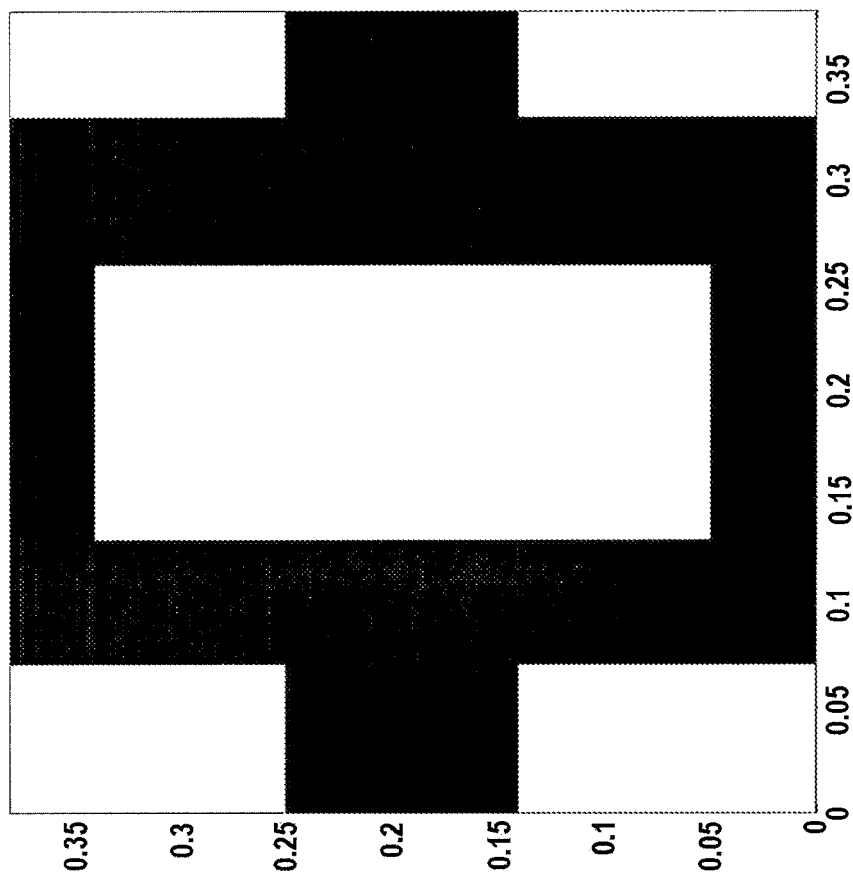
FIG. 24B
FIG. 24A

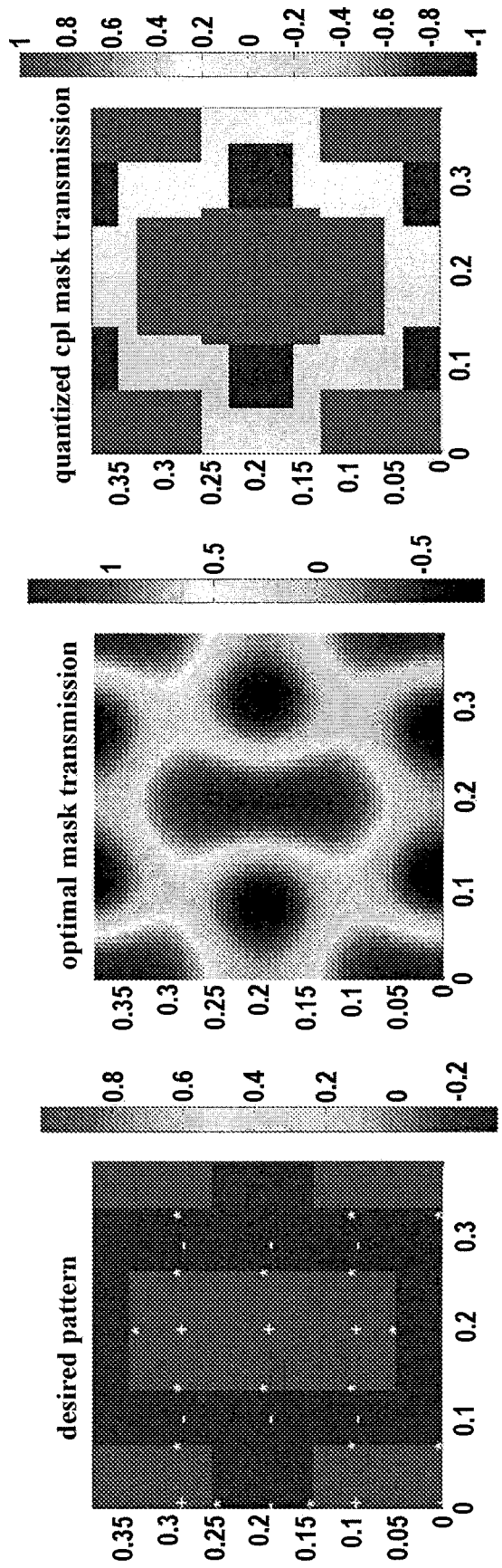

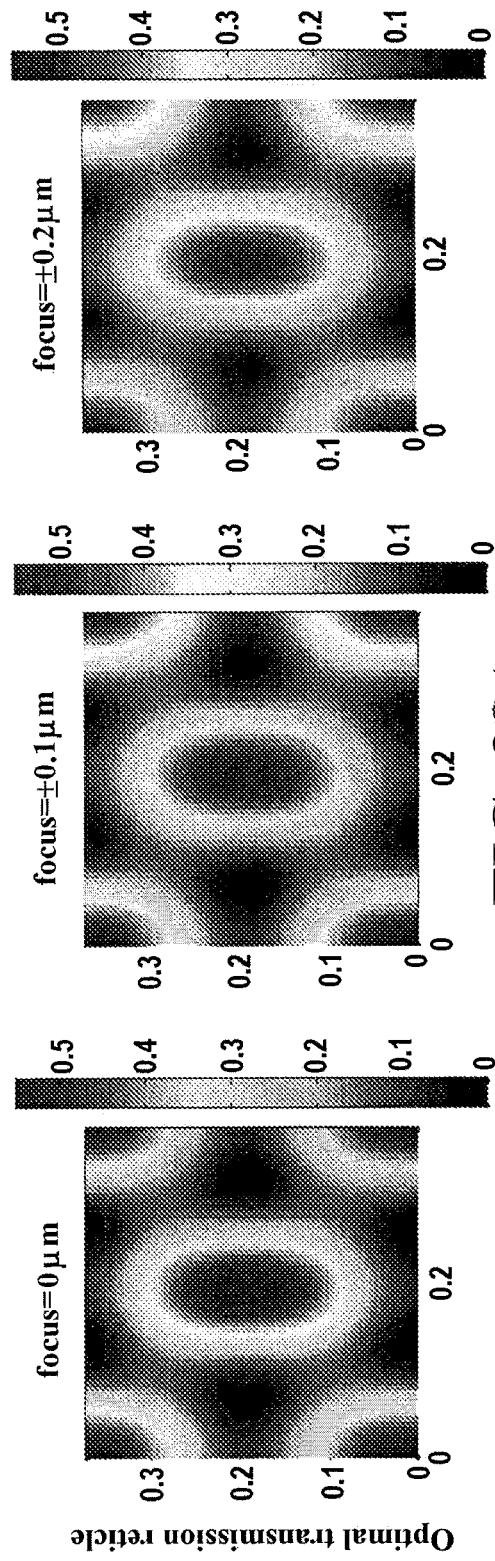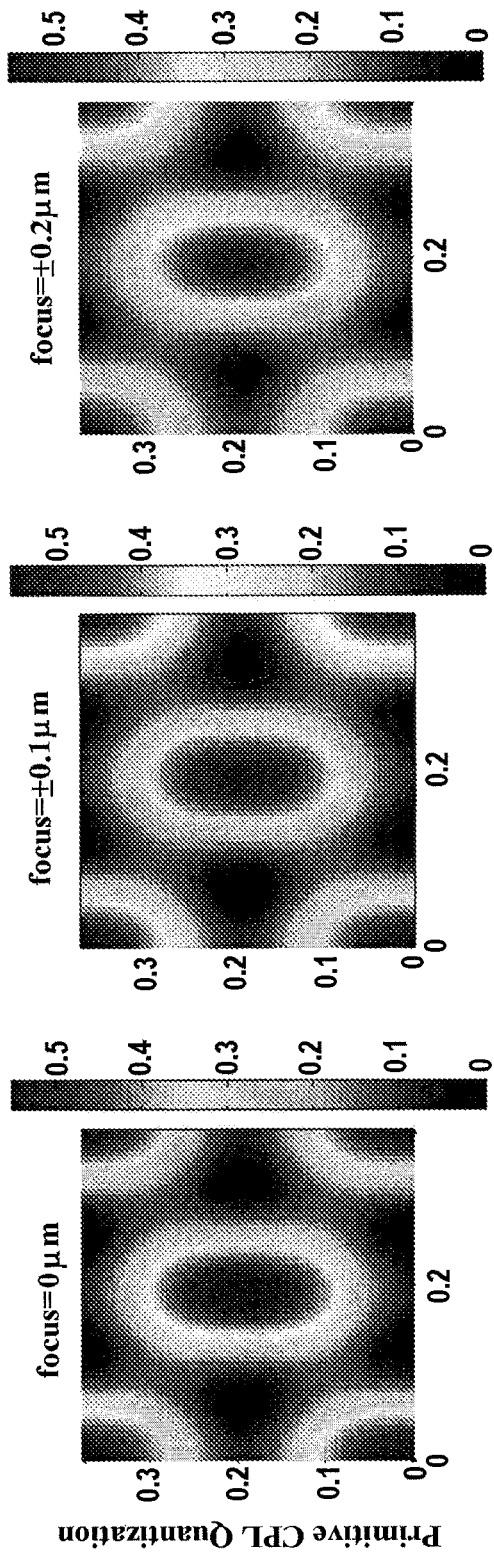
FIG. 28A
FIG. 28B

SOURCE AND MASK OPTIMIZATION BY CHANGING INTENSITY AND SHAPE OF THE ILLUMINATION SOURCE AND MAGNITUDE AND PHASE OF MASK DIFFRACTION ORDERS

CROSS REFERENCE TO RELATED APPLICATIONS

This application is a Continuation of U.S. patent application Ser. No. 12/962,522, filed Dec. 7, 2010, (Now U.S. Pat. No. 8,730,452), which is a Divisional of U.S. patent application Ser. No. 12/186,410, filed Aug. 5, 2008, (Now U.S. Pat. No. 7,864,301), which is a Divisional of U.S. patent application Ser. No. 10/813,626, filed Mar. 31, 2004, (Abandoned), which claims the benefit of U.S. Provisional Patent Application Ser. No. 60/458,365, filed Mar. 31, 2003, each of which is hereby incorporated by reference in its entirety.

BACKGROUND

The field of the invention relates generally to a method and program product for optimizing illumination source and mask features for microlithography. Lithographic apparatus can be used, for example, in the manufacture of integrated circuits (ICs). In such a case, the photolithographic mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book Microchip *Fabrication: A Practical Guide to Semiconductor Processing*, Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process is often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Various techniques exist to achieve illumination optimization for photolithography. Various mask optimization techniques also have been known. However, currently illumination optimization and mask optimization are not generally linked. U.S. Pat. No. 6,563,566 to Rosenbluth et al. discloses to perform illumination optimization and mask optimization through a series of calculations which attempt to linearize the optimization of the mask transmission. Rosenbluth discloses to maximize the minimum NILS (normalized image log slope) and to select various constraints to be used in the calculations. Rosenbluth also recognizes that the calculations may be limited relying on the symmetry of a mask. However, the linearization of the mask transmission used by Rosenbluth requires using several approximations in the calculations, instead of the actual imaging equations themselves, which produce errors in implementing a mask to form a desired image. The linearization of the mask transmission also requires the use of a significant number of variables, which requires significant computation time to perform the calculations.

As logic feature sizes decrease, there is a need to provide mask implementations that precisely form a desired image with minimum computational time.

SUMMARY OF THE INVENTION

In accordance with the present invention, a method for optimizing an illumination source for a mask illumination may comprise the steps of: providing illumination from an illumination source to a plurality of source points and a predetermined mask pattern; selecting fragmentation points in an image plane of an image formed by the illumination provided to the predetermined mask pattern; determining an intensity and image log slope of illumination at each fragmentation point; determining an optimal illumination source as an illumination source which maximizes the image log slope at the selected fragmentation points and has an intensity within a predetermined range.

In accordance with the present invention, a method for determining an optimal mask may comprise the steps of: determining optimum diffraction orders of an ideal mask; obtaining an optimal transmission mask based on the optimized diffraction orders of the ideal mask; and determining an optimal mask based on the optimal transmission mask, wherein the optimum diffraction orders of the ideal mask are determined by determining a magnitude and phase of diffraction orders which form an image in an image plane which maximizes the minimum illumination log slope at user selected fragmentation points while forcing an intensity of illumination at the fragmentation points to be within a predetermined range.

In accordance with the present invention, a method of obtaining an optimum source and an optimum mask may comprise the steps of: providing illumination from an illumination source to a plurality of source points and a predetermined mask pattern; selecting fragmentation points in an image plane of an image formed by the illumination provided to the predetermined mask pattern; determining an intensity and image log slope of illumination at each fragmentation point; and simultaneously changing the intensity and shape of the illumination source and the magnitude and phase of diffraction orders of the mask to form an image in the image plane that maximizes the minimum image log slope at the fragmentation points while forcing the intensity at the fragmentation points to be within a predetermined intensity range.

In accordance with the present invention, a method of optimizing a placement of transmission and phase shifting features on a mask may comprise the steps of: obtaining optimal mask transmission characteristics based on optimum diffraction orders of the mask; locating areas of maximum transmission and minimum transmission; assigning a primitive area as an area centered on an area of maximum transmission or minimum transmission; varying edges of each primitive area to match optimal diffraction orders, wherein each primitive area has a minimum size which is substantially equal to a minimum feature size of the mask.

In a method of the present invention, the step of obtaining optimal mask transmission characteristics may include a step of determining horizontal diffraction orders of an optimum mask, wherein the number of horizontal diffraction orders is determined according to the equation:

$$n = 2\text{floor}\left[\frac{P_x(\sigma_{max}+1)NA}{\lambda}\right]+1$$

where m is the number of horizontal diffraction orders; $\lambda$ is a wavelength of the illumination source; NA is a numerical aperture of the projection optics; and $\sigma_{max}$ is a radial extent of the distribution of a beam of light from the illumination source.

In a method of the present invention, the step of obtaining optimal mask transmission characteristics may include a step of determining vertical diffraction orders of an optimum mask, wherein the number of vertical diffraction orders is determined according to the equation:

$$n = 2\text{floor}\left[\frac{P_y(\sigma_{max}+1)NA}{\lambda}\right]+1$$

where n is the number of vertical diffraction orders; $\lambda$ is a wavelength of the illumination source; NA is a numerical aperture of the projection optics; and $\sigma_{max}$ is a radial extent of the distribution of a beam of light from the illumination source.

In accordance with the present invention a computer readable medium may contain instructions for a computer to perform a method for optimizing an illumination source for a mask illumination which may comprise the steps: of providing illumination from an illumination source to a plurality of source points and a predetermined mask pattern; selecting fragmentation points in an image plane of an image formed by the illumination provided to the predetermined mask pattern; determining an intensity and image log slope of illumination at each fragmentation point; determining an optimal illumination source as an illumination source which maximizes the image log slope at the selected fragmentation points and has an intensity within a predetermined range.

In accordance with the present invention a computer readable medium may contain instructions for a computer to cause performance of a method for determining an optimal mask which may comprise the steps of: determining optimum diffraction orders of an ideal mask; obtaining an optimal transmission mask based on the optimized diffraction orders of the ideal mask; and determining an optimal mask based on the optimal transmission mask, wherein the optimum diffraction orders of the ideal mask are determined by determining a magnitude and phase of diffraction orders which form an image in an image plane which maximizes the minimum illumination log slope at user selected fragmentation points while forcing an intensity of illumination at the fragmentation points to be within a predetermined range.

In accordance with the present invention a computer readable medium may contain instructions for a computer to cause performance of a method of obtaining an optimum source and an optimum mask which may comprise the steps of providing illumination from an illumination source to a plurality of source points and a predetermined mask pattern; selecting fragmentation points in an image plane of an image formed by the illumination provided to the predetermined mask pattern; determining an intensity and image log slope of illumination at each fragmentation point; and simultaneously changing the intensity and shape of the illumination source and the magnitude and phase of diffraction orders of the mask to form an image in the image plane that maximizes the minimum image log slope at the fragmentation points while forcing the intensity at the fragmentation points to be within a predetermined intensity range.

In accordance with the present invention a computer readable medium may contain instructions for a computer to cause performance of a method of optimizing a placement of transmission and phase shifting features on a mask which may comprise the steps of: obtaining optimal mask transmission characteristics based on optimum diffraction orders of the mask; locating areas of maximum transmission and minimum transmission; assigning a primitive area as an area centered on an area of maximum transmission or minimum transmission; varying edges of each primitive area to match optimal diffraction orders, wherein each primitive area has a minimum size which is substantially equal to a minimum feature size of the mask.

In accordance with the present invention a computer readable medium may contain instructions for a computer to cause optimizing a placement of transmission and phase shifting features on a mask comprising the steps of: obtaining optimal mask transmission characteristics; locating areas of minimum transmission; assigning a primitive area as an area centered on an area of minimum transmission; and varying edges of the primitive area to match optimal diffraction orders, wherein the primitive area has a minimum size which is substantially equal to a minimum feature size of the mask.

A computer readable medium may further contain instructions for a computer to cause the steps of: locating an area of maximum transmission; assigning a transmission primitive area as an area centered on an area of maximum transmission; varying edges of the transmission primitive area to match optimal diffraction orders, wherein the transmission primitive area has a minimum size which is substantially equal to a minimum feature size of the mask.

In a computer readable medium of the present invention, the step of obtaining optimal mask transmission characteristics may include a step of determining horizontal diffraction orders of an optimum mask, wherein the number of horizontal diffraction orders is determined according to the equation:

$$m = 2\text{floor}\left[\frac{P_x(\sigma_{max} + 1)NA}{\lambda}\right] + 1$$

where m is the number of horizontal diffraction orders; $\lambda$ is a wavelength of the illumination source; NA is a numerical aperture of the projection optics; and $\sigma_{max}$ is a radial extent of the distribution of a beam of light from the illumination source.

In a computer readable medium of the present invention, the step of obtaining optimal mask transmission characteristics may include a step of determining vertical diffraction orders of an optimum mask, wherein the number of vertical diffraction orders is determined according to the equation:

$$n = 2\text{floor}\left[\frac{P_y(\sigma_{max} + 1)NA}{\lambda}\right] + 1$$

where n is the number of vertical diffraction orders; $\lambda$ is a wavelength of the illumination source; NA is a numerical aperture of the projection optics; and $\sigma_{max}$ is a radial extent of the distribution of a beam of light from the illumination source.

In accordance with the present invention, an apparatus for optimizing an illumination source for a mask illumination may comprise: an input unit which inputs characteristics of an illumination device; and a processing unit which is configured to change an intensity and shape of an illumination to form an image in an image plane that maximizes the minimum image log slope at user selected fragmentation points.

In accordance with the present invention, an apparatus for optimizing a mask may comprise: an input unit which inputs a desired image pattern; and a processing unit which is configured to change a magnitude and phase of diffraction orders to form an image in the image plane that maximizes the minimum image log slope at user selected fragmentation points while forcing the intensity at the fragmentation points to be within a predetermined intensity range.

In accordance with the present invention, an apparatus for obtaining an optimum source and an optimum mask may comprise: an input unit which accepts user inputs; and a processing unit configured to simultaneously change an intensity and shape of an illumination source and change a magnitude and phase of diffraction orders to form an image in an image plane which maximizes a minimum image log slope at user selected fragmentation points while forcing an intensity at the fragmentation points to be within a predetermined intensity range.

In accordance with the present invention, an apparatus for optimizing a placement of transmission and phase shifting features on a mask comprising: an input unit which inputs characteristics of an illumination device; and a processing unit which is configured to obtain optimal mask transmission characteristics based on optimum diffraction orders of the mask, locate areas of minimum transmission and maximum transmission, assign primitive areas as areas centered on an area of minimum transmission or an area of maximum transmission, and vary edges of the primitive area to match optimal diffraction orders, wherein the primitive areas have a minimum size which is substantially equal to a minimum feature size of the mask.

In an apparatus of the present invention, the optimal mask transmission characteristics may include horizontal diffraction orders of an optimum mask, and the number of horizontal diffraction orders is determined according to the equation:

$$m = 2\text{floor}\left[\frac{P_x(\sigma_{max} + 1)NA}{\lambda}\right] + 1$$

where m is the number of horizontal diffraction orders; $\lambda$ is a wavelength of the illumination source; NA is a numerical aperture of the projection optics; and $\sigma_{max}$ is a radial extent of the distribution of a beam of light from the illumination source.

In an apparatus of the present invention, the optimal mask transmission characteristics may include vertical diffraction orders of an optimum mask, wherein the number of vertical diffraction orders is determined according to the equation:

$$n = 2\text{floor}\left[\frac{P_y(\sigma_{max} + 1)NA}{\lambda}\right] + 1$$

where n is the number of vertical diffraction orders; $\lambda$ is a wavelength of the illumination source; NA is a numerical aperture of the projection optics; and $\sigma_{max}$ is a radial extent of the distribution of a beam of light from the illumination source.

The present invention provides an advantage of a fast computation of mask parameters by limiting the number of mask optimization variables considered. The number of illumination optimization variables may be reduced by relying on the mask symmetry. The number of mask optimization variables may also be reduced by optimizing the diffraction orders of the mask rather than performing computations with the mask transmission. Optimization of the mask diffraction orders is a non-linear process; hence, reducing the number of variables decreases computation time. Furthermore the mask transmission is optimized by performing a non-linear optimization of the diffraction orders followed by a linear optimization of selecting quantized mask transmissions to equal the optimal diffraction orders.

BRIEF DESCRIPTION OF THE DRAWINGS

The accompanying drawings, which are incorporated in and form a part of the specification, together with the description serve to explain the principles of the invention. In the drawings:

FIGS. 9A-9C illustrate the application of the optimal illumination to an optimal mask (FIG. 9A);

FIGS. 11A and 11B illustrate aerial image comparisons between a CPL mask and an 8% AttPSM using hexapole and annular illumination, respectively;

FIGS. 19A-C illustrate the diffraction orders of the exemplary mask in FIG. 18A;

FIG. 24A illustrates a Staggered Rectangular Contact Array and FIG. 24B illustrates and an illumination source which has been optimized to produce the pattern according to the principles of the present invention;

FIGS. 26A-C illustrate the use of primitive edges to create a quantized CPL mask according to the principles of the present invention;

FIGS. 28A and 28B illustrate the trade-off between obtaining an optimal transmission and using a CPL mask;

DETAILED DESCRIPTION OF THE INVENTION

Figures 1A, 1B:
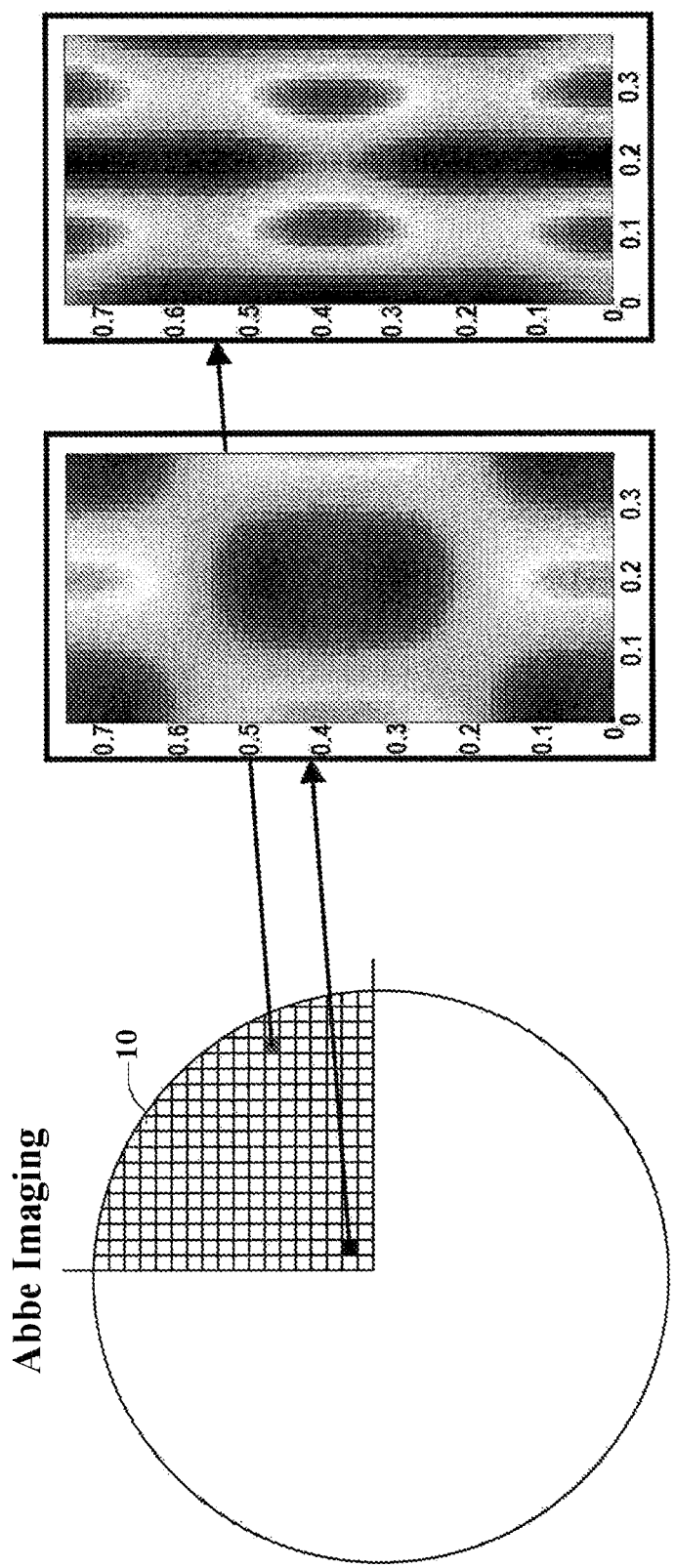
FIGS. 1A and 1B illustrate an exemplary illumination using Abbe imaging according to the present invention.

Disclosed is a method for optimizing the illumination source and the mask for creating a desired pattern in the image plane. In a preferred implementation, an image is formed in the image plane with the highest image log slope (ILS) in the optimization process at user selected fragmentation points. The image may be optimized by changing the intensity and shape of the illumination source and by changing the magnitude and phase of the diffraction orders. In a preferred implementation, the illumination source is first optimized and then the mask diffraction orders are optimized; however, the illumination source and mask diffraction orders can be optimized simultaneously.

Since the ILS is a non-linear quantity, the optimization of the illumination source and the mask is a non-linear optimization. Those of skill in the art appreciate that in a non-linear optimization the computational time is a function (e.g. a geometric function) of the number of variables. Therefore to speed the computational time, the number of variables must be minimized. In the illumination source optimization, in accordance with the invention, the number of variables may be reduced by taking advantage of the symmetry of mask. For example, if the mask is symmetric with respect to the vertical and horizontal axes, the illumination source will be symmetric with respect to the vertical and horizontal axes, allowing optimization to be achieved using a quarter of the illumination source.

In the mask optimization in accordance with the invention, the number of variables may be reduced by performing an optimization of the diffraction orders in the spatial frequency domain. The mask optimization is preferably performed in the spatial frequency domain rather than the spatial domain because the lens (e.g. the entrance pupil of the projection optics) and illumination source limit the number of diffraction orders which are used to form the projected image. In addition to optimizing the ILS at user selected fragmentation points, the shape of the image formed by the mask must match the desired pattern. The matching is preferably done by adding a constraint that intensity at all of the fragmentation points are the same or within a predetermined range of deviation of each other, e.g. a ±2% deviation. Preferably, after optimizing the mask diffraction orders, the optimal mask transmission may be calculated by taking the inverse Fourier transform of the mask diffraction orders.

In the optimal mask transmission, the electric field transmission has a continuous magnitude from 0 to 1 and a continuous phase from −180 degrees to +180 degrees. Since the mask has a limited number of electric field transmissions, the optimal transmission is preferably quantized by the limited number of transmissions. This quantization is preferably done by selecting quantized mask transmission areas such that the diffraction orders of the quantized mask substantially equal the optimal diffraction orders. Because the Fourier transform is a linear calculation, selecting quantized mask transmission areas such that the quantized mask diffraction orders equal the optimal diffractions is a linear process that can be calculated quickly.

FIGS. 1A and 1B illustrate an illumination process using Abbe imaging. As illustrated in FIG. 1A, each source point 10 may be illuminated by selectively positioning an illumination source (not shown) at the desired source points 10. The total image intensity is the summation of the intensity from each of the individual source points 10. The illumination patterns are real (in a mathematical sense), hence, the illumination must have even symmetry. Preferably, the source points are chosen to enhance the normalized image log slope (NILS) at fragmentation points on the image plane. A fragmentation point is commonly known to be a point on the image plane which is smaller than λ/2NA.

Figure 7B:
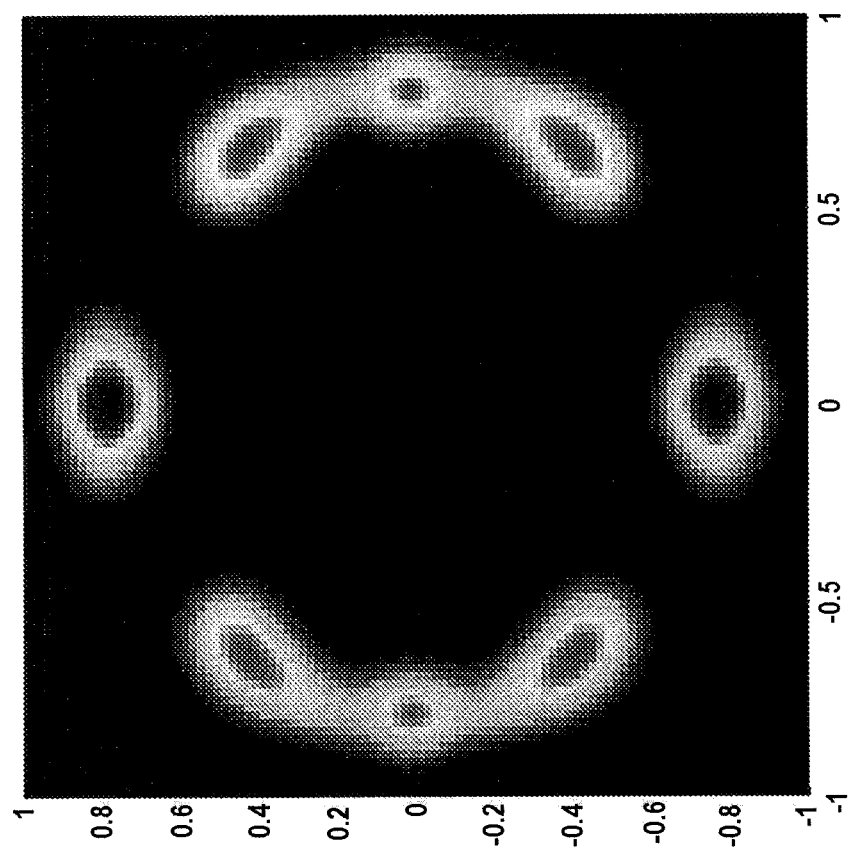
FIG. 7A illustrates an exemplary DRAM mask pattern and FIG. 7B illustrates an optimum illumination source used with the mask pattern of FIG. 7A.
Figure 7A:
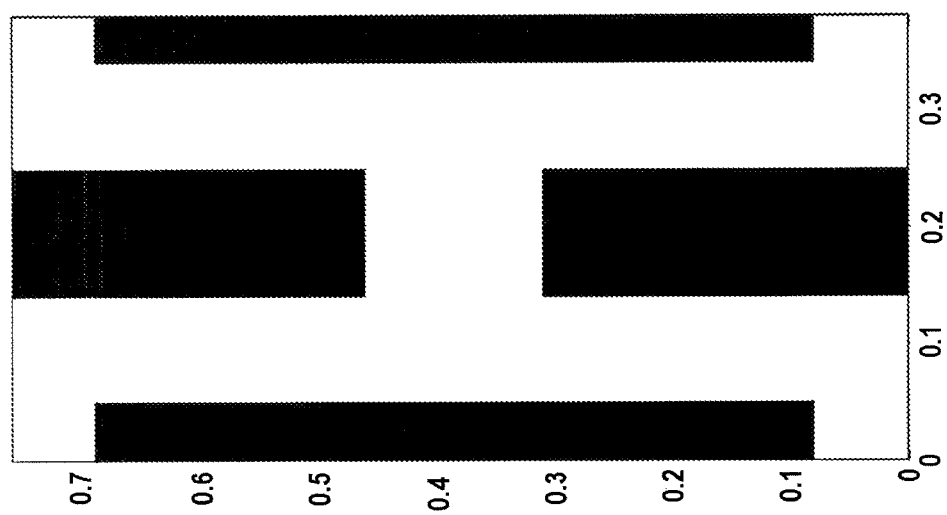

FIG. 1B illustrates the use of the illumination source with a typical DRAM mask pattern (referred to as a "Brickwall"). FIG. 7A illustrates a "Long Brickwall" pattern that may be used. In FIG. 1B, portions of the resulting image are shown from illuminating a Brickwall pattern on a mask of a 190 nm pitch with an illumination of λ/800 with a numerical aperture (NA) at the entrance pupil of the projection optics at 0.8. As can be seen in FIG. 1B, the light areas represent an image intensity that enhances the NILS while the dark areas represent an image intensity that degrades the NILS. The illumination source points that provide the best result, e.g. provide the most enhanced NILS, are preferably selected to optimize the shape of the illumination source.

Figure 2:
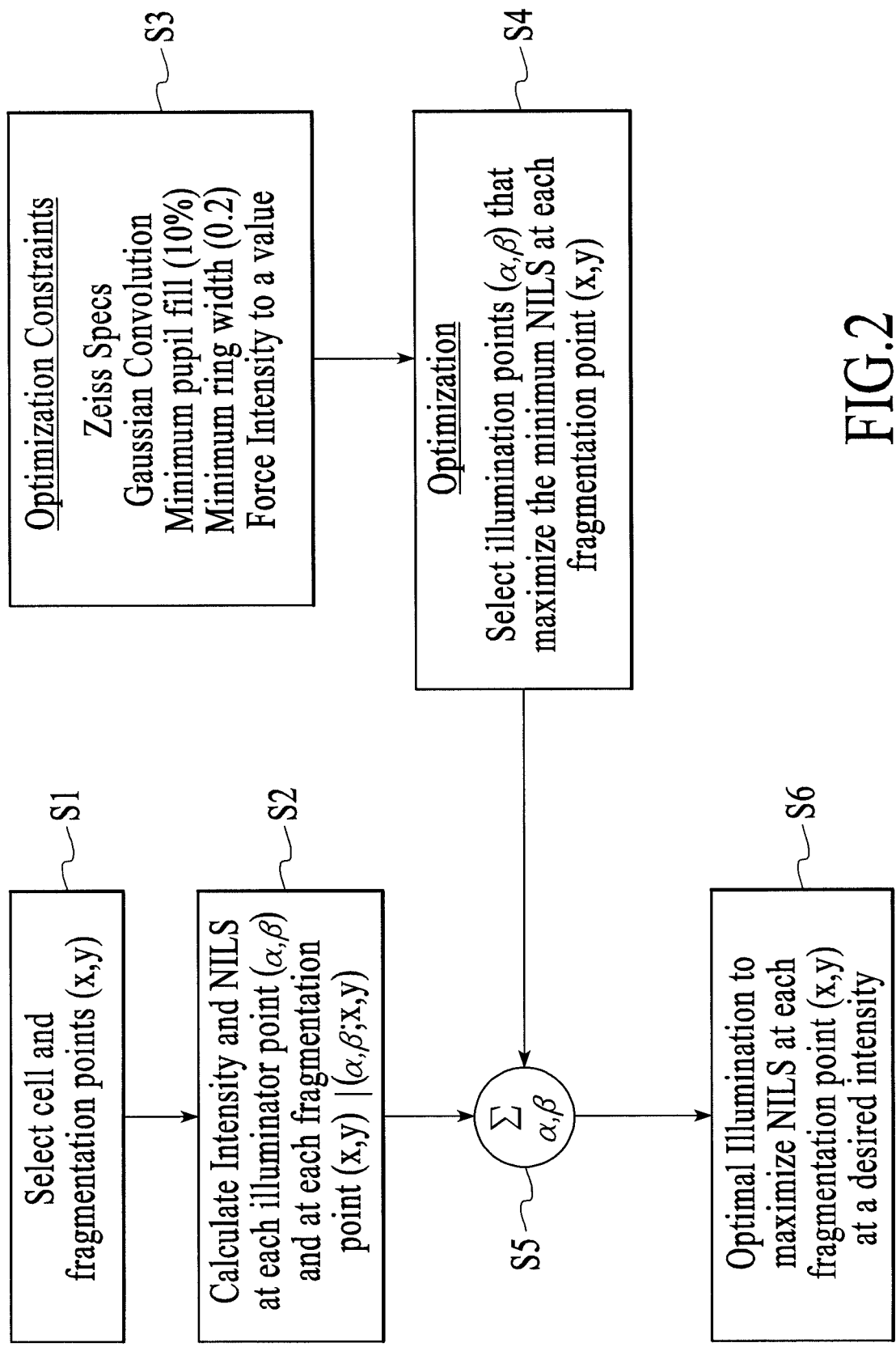
FIG. 2 illustrates an exemplary process for obtaining illumination optimization according to the present invention.

An exemplary process for performing the illumination source optimization is illustrated in FIG. 2. The illumination source optimization in this process is preferably linear with non-linear constraints. Preferably, the mask transmission magnitude and phase is optimized according to the present invention.

As illustrated in step S1 of FIG. 2, the user preferably specifies the selected cell (e.g. region on the desired pattern) and the fragmentation points (x,y) (see FIG. 9A) to be evaluated. In the process, illustrated in step S2, a microprocessor preferably calculates the intensity and the NILS at each illuminator point (α,β) and at each fragmentation point (x,y), i.e., the microprocessor calculates I(α,β; x,y) and NILS(α,β; x,y). As also illustrated in step S3 of FIG. 2, the microprocessor utilizes specifications of the illumination system, such as an illumination system from Zeiss (identified as "Zeiss Specs" in FIG. 2), to perform a Gaussian convolution, to determine the minimum pupil fill (e.g., 10%), the minimum ring width (e.g. 0.2) and to force the intensity to a predetermined value. An optimization process is illustrated in step S4, in which illumination points (α,β) that maximize the minimum NILS at each fragmentation point (x,y) are selected. As illustrated in step S5, the intensity I(α,β; x,y) and NILS(α,β; x,y) at each illumination point and each fragmentation point are preferably summed with the selected illumination points that maximize the minimum NILS at each fragmentation point. The optimal illumination source to maximize the NILS at each fragmentation point (x,y) at a desired intensity is determined, as illustrated by step S6.

Accordingly, in the preferred implementation of the process in FIG. 2, discussed above, the intensity and shape of the illumination may be changed to form an image in the image plane that maximizes the minimum ILS at user selected fragmentation points while forcing the intensity at the fragmentation points to be within a predetermined intensity range.

Figure 3:
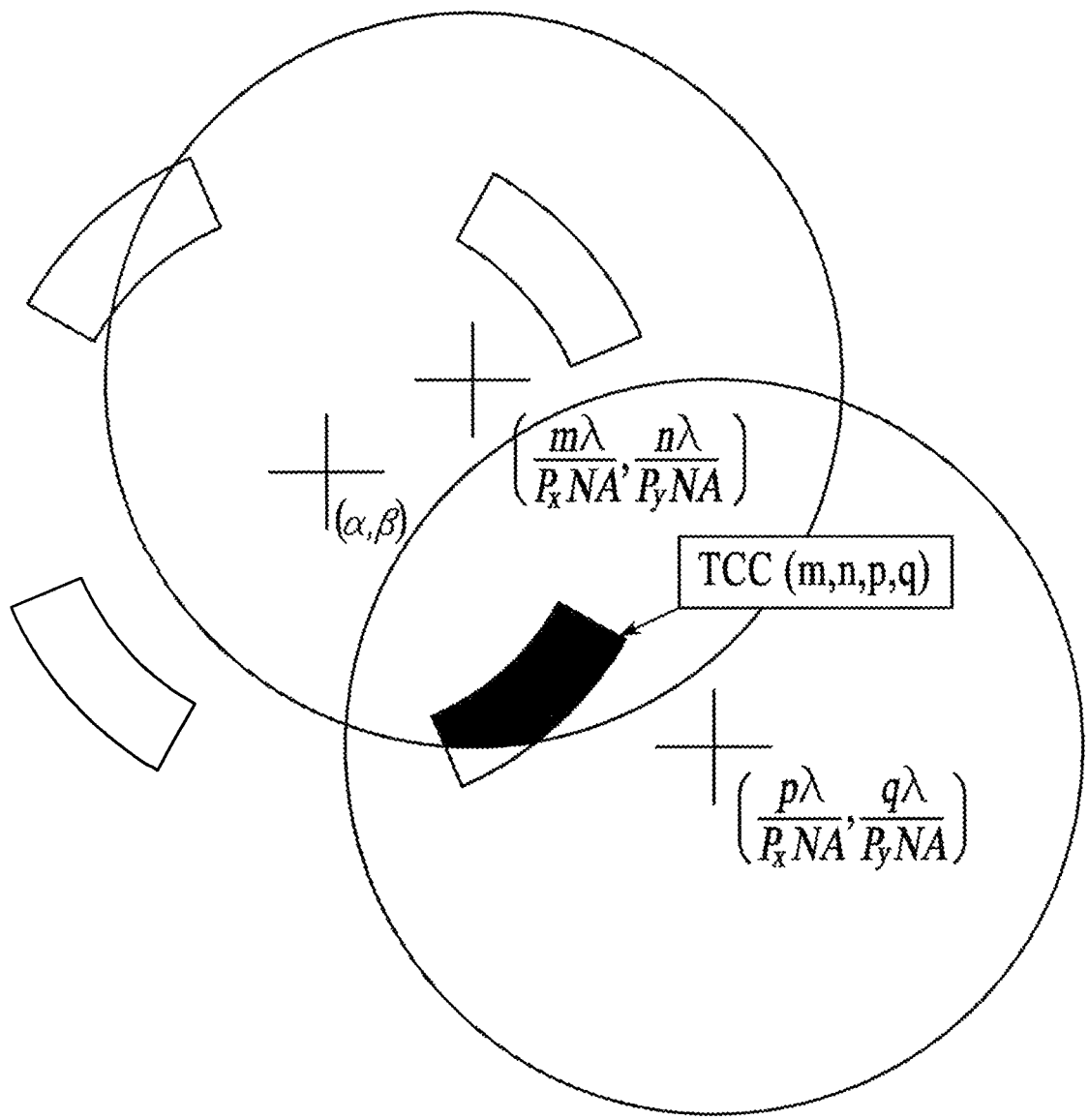
FIG. 3 provides a graphical representation of the generation of transmission cross coefficients (TCC) according to the present invention.

FIG. 3 illustrates an exemplary mask optimization process according to the present invention. A technique known as Hopkins Imaging may be used, in which the log slope is attempted to be maximized by changing the pupil to maximize the NILS. Those of skill in the art will appreciate that Abbe Imaging may also be used. Those of skill in the art appreciate that in Abbe Imaging, an image is created for each point and the images are added up and integrated over the source last. Abbe Imaging is generally considered to be spatially incoherent. Those of skill in the art appreciate that in Hopkins Imaging the integration is over the source first and a transfer function is obtained. It may be easier to obtain a mask optimization once from the transmission cross coefficients (TCC) and describe the entire scanner and stepper optics. For mask optimization, the Eigen values decay rapidly to represent the TCC with a few Eigen functions. This speeds computation time.

FIG. 3 also illustrates the creation of the TCC using Hopkins imaging. The TCC is an autocorrelation of the illumination pupil with the projection pupil. FIG. 3 illustrates the autocorrection of the illumination pupil centered at (0,0) with the projection pupil centered at $$\frac{m\lambda}{P_x NA}, \frac{n\lambda}{P_y NA}$$

and with the complex conjugate of the projection pupil centered at $$\frac{p\lambda}{P_x NA}, \frac{q\lambda}{P_y NA},$$

where NA represents the numerical aperture of the projection optics, and λ represents the wavelength of the illumination source.

In performing the Hopkins Imaging, the integration occurs over the source first to form the image transfer cross coefficients (TCC), illustrated as TCC(m, n, p, q) in FIG. 3.

The TCC is an autocorrelation of the illumination pupil with the projection pupil and is a four dimensional (4-D) function. The next step is to diagonalize the TCC to reduce the problem to a sum of two dimensional functions. These two dimensional functions are a set of orthogonal eigenfunctions in which each eigenfunction is weighted by the eigenvalue, i.e., eigenfunctions with higher eigenvalues have a larger impact on the image. These eigenfunctions form a set of image kernels which are used in the calculation of the image in the object plane. The diagonalization operation may be performed by any known functions, such as singular value decomposition used in NTI Nanosurfer, or in MG Calibre. Those of skill in the art will also appreciate that a calibrated MT Kernel can also be used.

Figure 4:
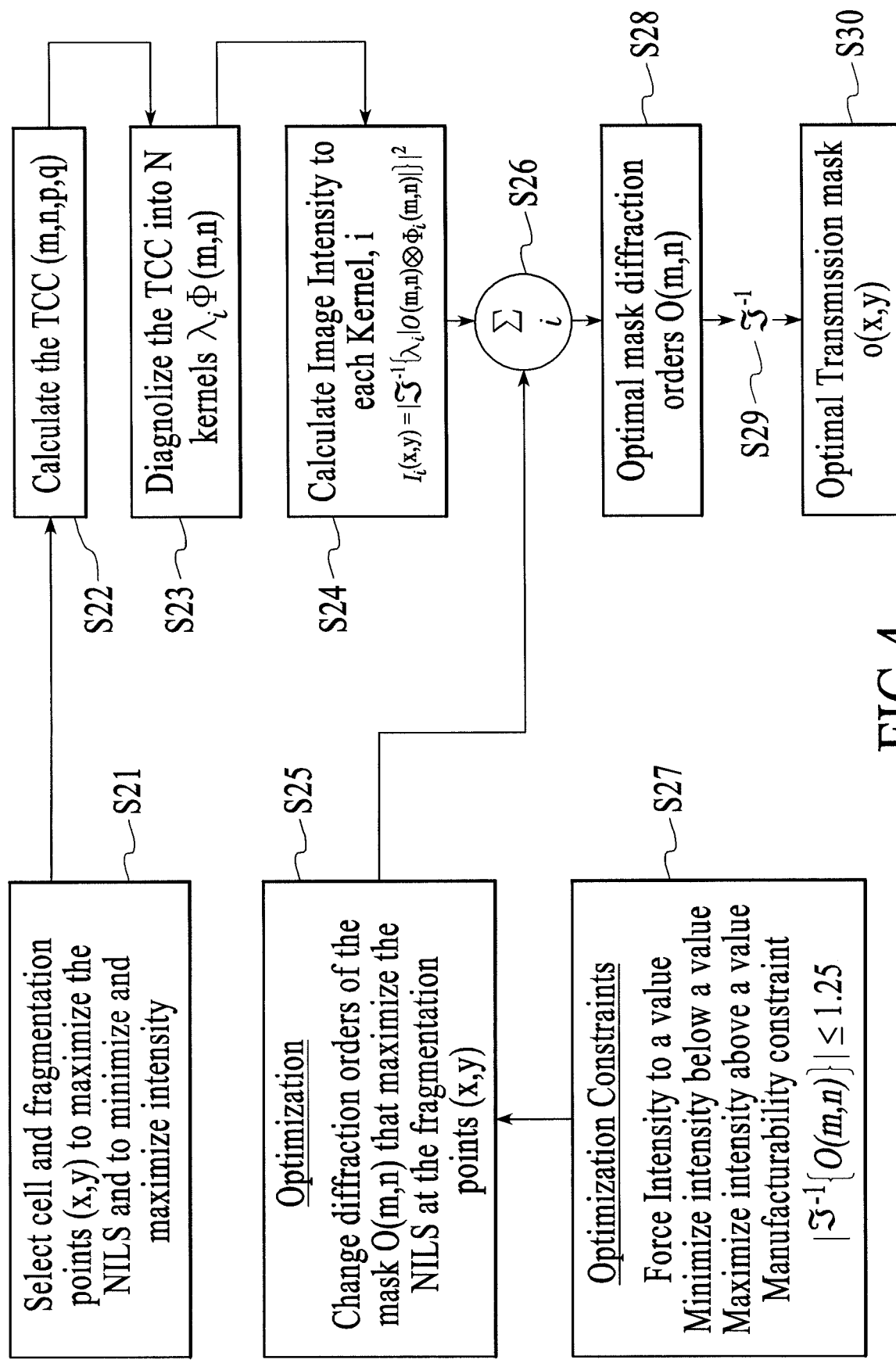
FIG. 4 illustrates an exemplary process for performing a mask optimization according to the present invention.

FIG. 4 illustrates an exemplary process for performing a mask optimization according to the present invention to obtain an ideal/optimum mask. Ideal mask transmission optimization is non-linear, however the conversion of the ideal mask transmission to a CPL mask implementation is a linear process. In the process illustrated in FIG. 4, the ideal mask is optimized in the frequency domain to speed convergence since the optimization is non-linear. As illustrated in step S21 of FIG. 4, the user selects the cell (e.g. region on the desired pattern) and fragmentation points (x,y) to maximize the NILS and to minimize and maximize intensity. The microprocessor then calculates the TCC (m, n, p, q) (step S22), diagonalizes the TCC into N kernels $\lambda\Phi(m,n)$ (step S23), and calculates the image intensity to each Kernel, i (step S24). The calculation of the image intensity to each Kernel, i may be performed according to equation 1.

$$I_i(x,y) = |\mathfrak{I}^{-1}\{\lambda_i | O(m,n) \cdot \Phi_i(m,n)|\}|^2 \quad \text{Eq. 1}$$

In the preferred implementation, the mask transmission range is chosen for CPL mask optimization. The transmission is allowed to be above 1 or below −1 because of the Gibb's phenomenon for image reconstruction after low pass filtering. The mask transmission range can be further modified for an attenuating phase shift mask (PSM). For an attenuating PSM (AttPSM), the mask transmission manufacturable range becomes $\mathfrak{I}^{-1}\{O(m,n)\} \leq 1.25$ and $\mathfrak{I}^{-1}\{O(m,n)\} \geq -1.25\sqrt{T}$ where T is the transmittance of the phase shift mask.

The microprocessor also receives optimization constraints that may be used to force intensity in the image plane to a predetermined value, minimize intensity below a predetermined value, maximize intensity above a predetermined value, or conform with a mask manufacturability constraint, as illustrated in step S27. The predetermined value is preferably selected as the intensity which provides the highest image log slope (ILS). An exemplary optimization constraint, which may limit the mask transmission to a manufacturable range, is set forth in equation 2.

$$\mathfrak{I}^{-1}\{O(m,n)\} \leq 1.25 \quad \text{Eq. 2}$$

The microprocessor preferably performs an optimization of the mask transmissions by changing the diffraction orders of the mask O(m,n) to maximize the NILS at the fragmentation points (x,y), as illustrated in step S25, such as by changing the magnitude and phase of the diffraction orders. The resulting diffraction orders of the optimization of step S25 is summed with the calculated image intensity of each Kernel, i, as illustrated in step S26, and the ideal optimum mask diffraction orders O(m,n) are provided, as illustrated in step S28. The inverse Fourier transform is then performed to convert the calculations to the spatial domain from the frequency domain, as illustrated in step S29, to obtain the optimal transmission mask o(x,y) in the spatial domain, as illustrated in step S30.

Figure 5:
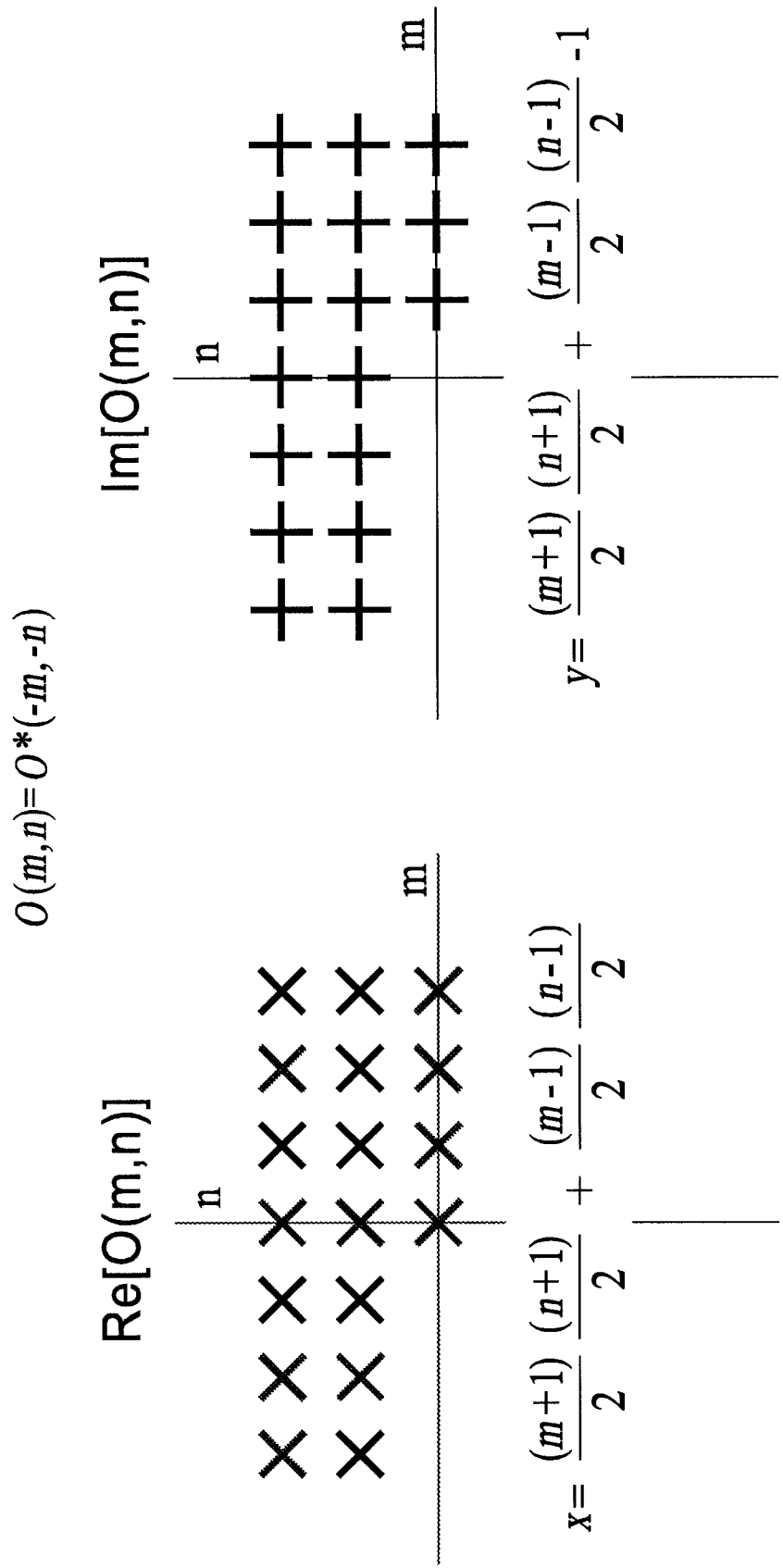
FIGS. 5A and 5B illustrate additional mask constraints that may be considered in optimizing a mask according to the present invention.

Additional mask constraints may be considered in optimizing a mask as illustrated in FIGS. 5A and 5B. The diffraction order may be evaluated by a real component and an imaginary component and may be represented by equation 3.

$$O(m,n) = O^*(-m,-n) \quad \text{Eq. 3}$$

Equation 3 guarantees that the mask is real in a mathematical sense. A real mask has transmission phases of 0° and 180°.

The number of real diffraction orders, x, may be characterized by equation 4.

$$x = \frac{(m+1)}{2}\frac{(n+1)}{2} + \frac{(m-1)}{2}\frac{(n-1)}{2} \quad \text{Eq. 4}$$

The number of imaginary diffraction orders, y, may be characterized by equation 5.

$$y = \frac{(m+1)}{2}\frac{(n+1)}{2} + \frac{(m-1)}{2}\frac{(n-1)}{2} - 1 \quad \text{Eq. 5}$$

However, a mask must be real, which restricts the number of orders to optimize to x+y, and the entrance pupil of the projection optics limits the number of diffraction orders that may be used by blocking the highest diffraction orders. Hence, the maximum number of horizontal diffraction orders that may be used, m, may be represented by equation 6.

$$n = \text{floor}\left[\frac{P_y(\sigma_{max}+1)NA}{\lambda}\right] + 1 \quad \text{Eq. 7}$$

Where m is the number of horizontal diffraction orders, $\sigma_{max}$ is a radial extent of the distribution of a beam of light from the illumination source, $\lambda$ is a wavelength of the illumination source, $P_x$, is the pitch of the repetitive cell in the x direction, and NA is a numerical aperture of the entrance pupil of the projection optics.

The number of vertical diffraction orders that may be used, n, may be represented by equation 7.

$$m = \text{floor}\left[\frac{P_x(\sigma_{max}+1)NA}{\lambda}\right] + 1 \quad \text{Eq. 6}$$

where n is the number of vertical diffraction orders, $\sigma_{max}$ is a radial extent of the distribution of a beam of light from the illumination source, $\lambda$ is a wavelength of the illumination source, $P_y$, is the pitch of the repetitive cell in the y direction, and NA is a numerical aperture of the entrance pupil of the projection optics.

In the preferred implementation, the definition for x and y of the pitch P is the axes of the Cartesian coordinate system in which the x axis is orthogonal to the y axis. However, the coordinate system can be any linear coordinate system in which any two lines, $g_1$, and $g_2$, intersecting at an origin, describe the linear coordinate system, i.e., $g_1$ and $g_2$, need not be necessarily orthogonal. In such a non-orthogonal coordinate system $P_x$ describes the pitch along the axis $g_1$ and $P_y$ describes the pitch along the axis $g_2$.

Accordingly, in the preferred implementation of the process illustrated in FIG. 4, as discussed above, the magnitude and phase of the diffraction orders may be changed to form an image in the image plane that maximizes the minimum ILS at user selected fragmentation points while forcing the intensity at the fragmentation points to be within a predetermined intensity range.

The illumination source optimization, illustrated in FIG. 2, may be simultaneously performed with the mask optimization, illustrated in FIG. 4. Accordingly, the intensity and shape of the illumination and the magnitude and phase of the diffraction orders may be simultaneously changed to form an image in the image plane that maximizes the minimum ILS at user selected fragmentation points while forcing the intensity at the fragmentation points to be within a predetermined intensity range.

Figure 6:
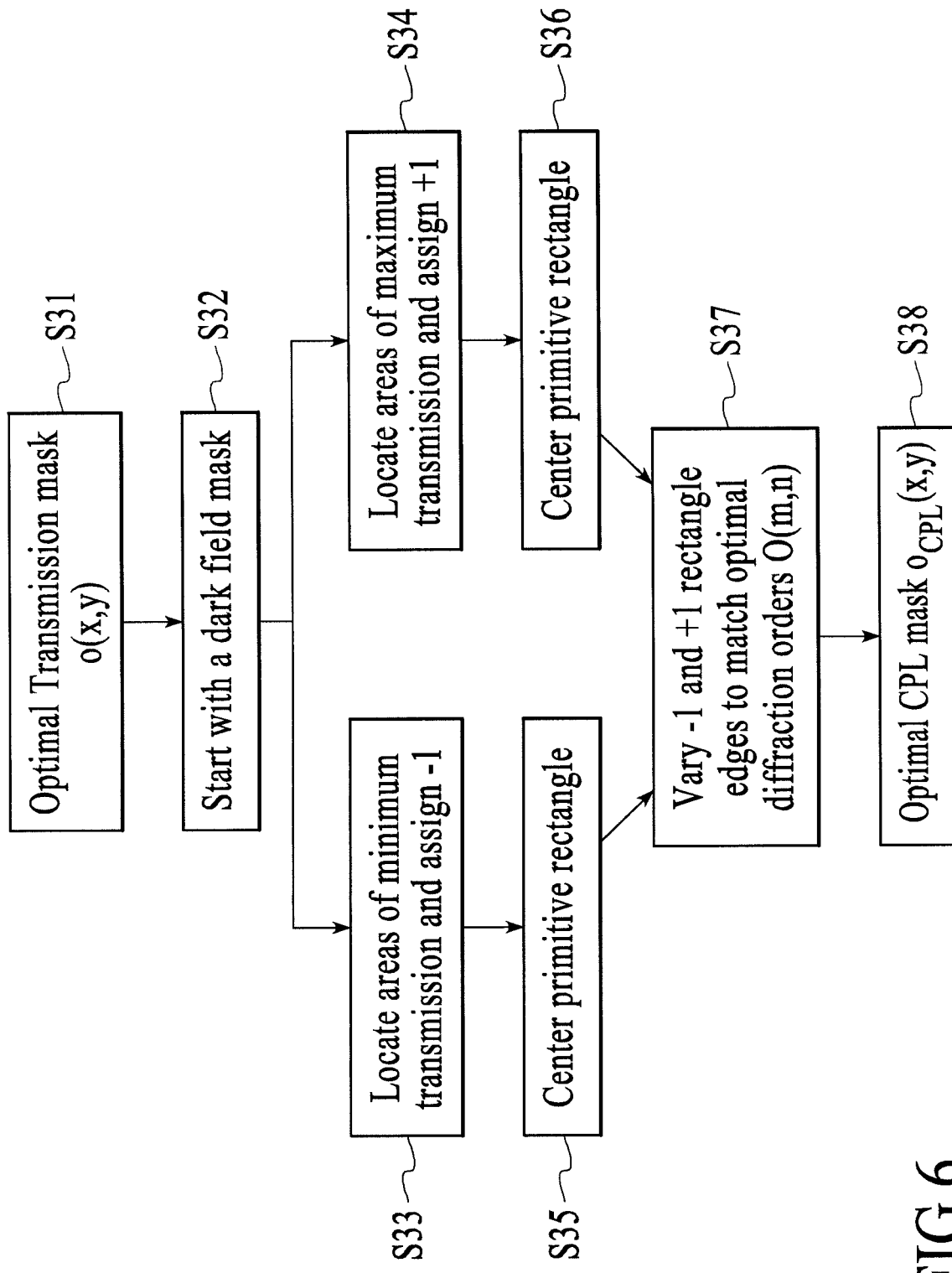
FIG. 6 illustrates an exemplary process for converting an optimal transmission mask to a CPL mask according to the present invention.

The ideal optimal transmission mask determined in the exemplary process of FIG. 4 maybe converted to be implemented in an actual mask, such as a CPL mask, as illustrated by the process illustrated in FIG. 6. As shown in step S31 in FIG. 6, an ideal optimal transmission mask, which may be determined according to the process illustrated in FIG. 4, is provided to be converted. In the process, a dark field mask is preferably used to start, as illustrated in step S32. Then areas of minimum transmission are located and assigned a −1 (step S33), and areas of maximum transmission are also located and assigned a +1 (step S34). Primitive rectangles preferably having a size set to a minimum feature size of a mask maker are assigned to the located minimum transmission areas and centered at a desired location (step S35). Likewise, primitive rectangles are assigned for the located areas of maximum transmission and centered (step S36). With the assigned −1 and +1 values, the diffraction orders needed for optimization start at $$-1 * \text{floor}\left[\frac{P_x(\sigma_{max}+1)NA}{\lambda}\right]$$

and end at $$+1 * \text{floor}\left[\frac{P_x(\sigma_{max}+1)NA}{\lambda}\right].$$

Hence, the maximum number of horizontal diffraction orders that may be used, m, may be represented by the equation:

$$m = 2\text{floor}\left[\frac{P_x(\sigma_{max}+1)NA}{\lambda}\right]+1 \qquad \text{Eq. 8}$$

and the equation:

$$n = 2\text{floor}\left[\frac{P_y(\sigma_{max}+1)NA}{\lambda}\right]+1 \qquad \text{Eq. 9}$$

may represent the maximum number of vertical diffraction orders, n that may be used. As illustrated in step S37, the −1 and +1 rectangle edges may be varied to match optimal diffraction orders O(m,n). The optimal CPL mask $O_{CPL}(x,y)$ may be formed as illustrated in step S38.

In the process illustrated in FIG. 6, the mask conversion is linear. However, CPL edge effects can also be taken into account by modifying the diffraction order through a perturbational model. In the perturbational model, edges of the mask are replaced with local areas that have transmission of neither 0, +1, or −1. These areas allow a scalar mask to emulate the vector edge effects from a CPL mask. Those of skill in the art will appreciate that many perturbational models may be used, such as those disclosed by J. Tirapu-Azpiroz, E. Yablonovitch, "Fast evaluation of Photomask, Near-Fields in Sub-Wavelength 19311×1 Lithography," Proc of the SPIE, vol. 5377 (2004), and K. Adam, A. Neureuther, "Simplified Models For Edge Transitions In Rigorous Mask Modeling," Proc. of the SPIE, vol. 4346 (2001), pp. 331-344.

FIG. 7A illustrates an exemplary DRAM mask pattern, commonly referred to as a Long Brickwall. FIG. 7B illustrates an optimum illumination source for the mask of FIG. 7A obtained according to the principles of the present invention. The illumination source and CPL mask are optimized for $\lambda/800$, NA=0.8 and 190 nm pitch (k1=0.306). The source illumination was optimized for the long brickwall using the algorithm outlined in FIG. 2. The illumination poles on the y axis help improve the NILS at the end of the long brick while the illumination poles on the x axis help improve the NILS in between the bricks.

Figures 8A, 8B, 8C:
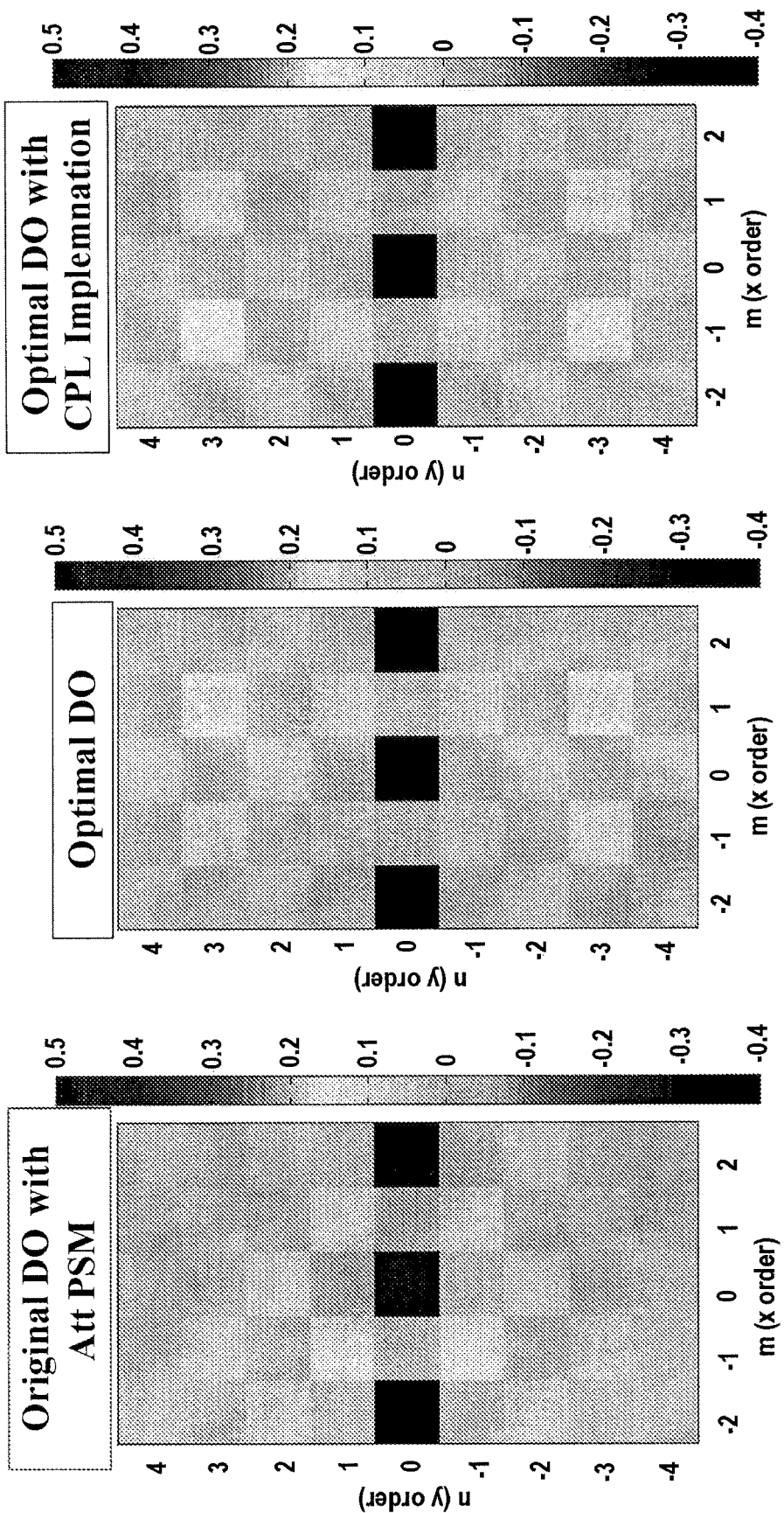
FIGS. 8A-8C illustrate diffraction orders of various masks to illustrate the diffraction orders of a CPL mask in accordance with the present invention.

FIGS. 8A-8C illustrate diffraction orders of various masks. FIG. 8A illustrates the original diffraction orders of the mask utilizing AttPSM. FIG. 8B illustrates the ideal optimal diffraction orders determined according to the process illustrated in FIG. 4 of the present invention. FIG. 8C illustrates the implementation of the optimal diffraction orders with a CPL mask, according to the process illustrated in FIG. 6 of the present invention. The optimal diffraction orders force more energy into the higher orders (±2,0) and (±1,±3). Those of skill in the art will appreciate that a CPL mask can represent the optimal diffraction orders almost identically.

FIGS. 9A-9C illustrate the application of the optimal illumination to an optimal mask (FIG. 9A). In FIG. 9A the "*" points identify the NILS optimization points, the "+" points identify the points at which intensity should be maximized, and the "−" points identify the points at which intensity should be minimized. The NILS optimization attempts to make the slope of the intensity at the image plane as large as possible to obtain a high contrast in printing the mask features. The NILS is preferably within a set value which is suitable for the determined NILS optimization points along a mask feature. Those of skill in the art will appreciate that a CPL mask has three phase values, +180, 0 and −180 degrees. The CPL mask illustrated in FIG. 8C is formed by quantizing the optimal mask transmission, to form a quantized CPL mask transmission.

Figure 10A:
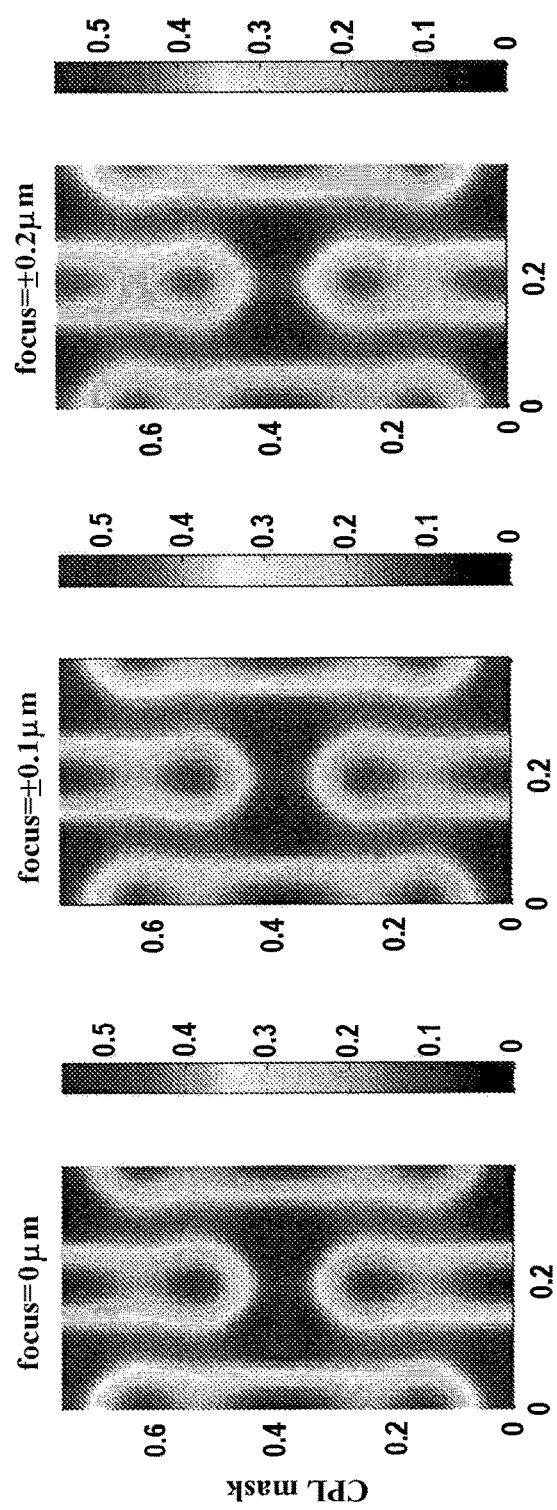
FIGS. 10A and 10B illustrate aerial image comparisons between a CPL mask and an 8% AttPSM (phase shifted mask)
Figure 10B:
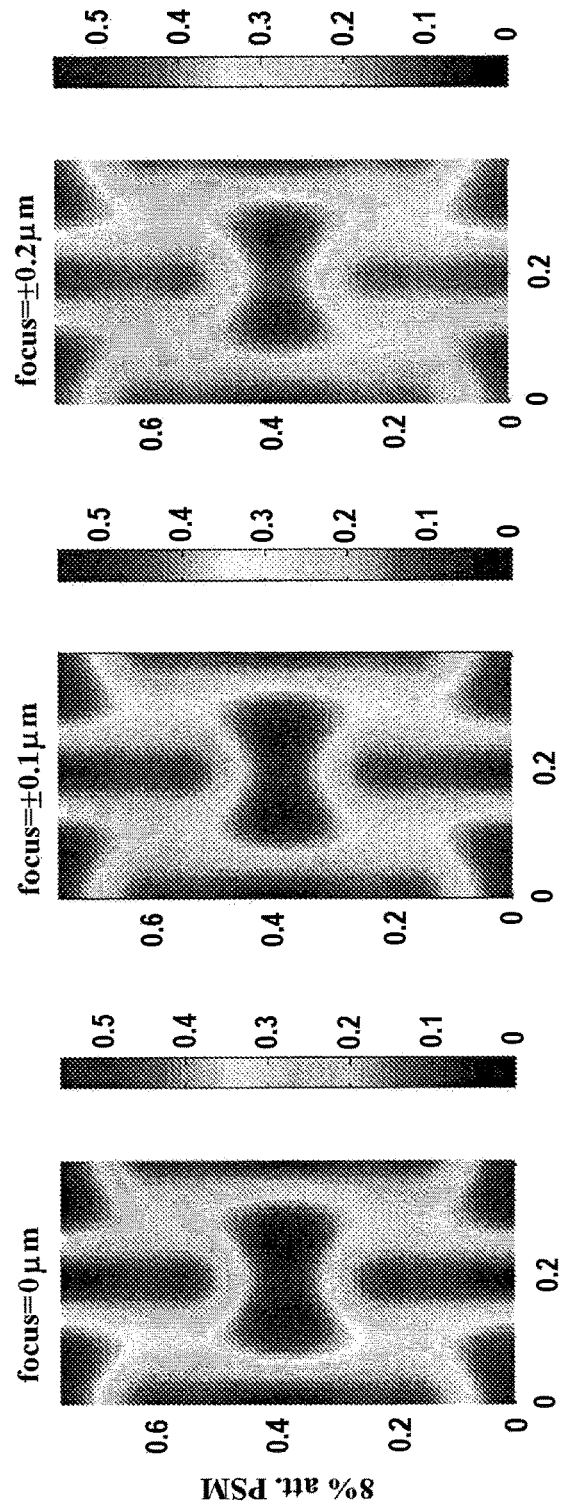

FIGS. 10A and 10B and 11A and 11B illustrate aerial image comparisons between a CPL mask and an 8% AttPSM (attenuated phase shifted mask). In FIG. 10A the CPL mask was exposed with hexapole illumination. In FIG. 10B the PSM mask was exposed with hexapole illumination. As illustrated in FIGS. 10A and 10B, the contrast and the NILS is much better in between the lines with the CPL mask than the PSM mask. It can be seen that CPL has a production worthy process margin while the 8% solution is less favorable. However, CPL has a little necking which may be correctable by adding more optimization points.

Also, as illustrated in FIG. 11A, the hexapole illuminator for 8% Att PSM also shows NILS improvement over annular illumination shown in FIG. 11B. However, a larger process margin may be gained by using CPL with the hexapole illuminator.

Optimizing the mask in the frequency domain limits the size of the optimization problem and speeds convergence. Reconstruction of the optimal CPL mask from the optimal diffraction orders is a linear problem in the frequency domain. Process window improvement may be optimal with the optimal diffraction orders for all structures, which may minimize the effects of focus and exposure variations in the scanner and in the wafer topography. Process window, as used herein, is the amount of exposure latitude (EL) as a function of depth of focus (DOF). Process window improvement with the optimal CPL may also be optimal. CPL may be used to improve the process window at a low k1 factor. The k1 factor as used herein may be defined by $CD*NA/\lambda$, where CD is the critical dimension of the feature to be printed, and $\lambda$ is the wavelength of the illumination source. Additionally, illumination optimization does not need to run first. Using the present invention the mask can be optimized to an existing OAI (quasar, cquad (a quadrupole illuminator with poles on the Cartesian x and y axes, such as a quasar illuminator rotated 45 degrees), annular illumination). Also, in the present invention, the mask can be optimized for a single or double exposure (1 or 2 masks) or for a 2 tone mask (binary or AttPSM). Most ideal transmission masks can be represented with CPL in accordance with the present invention.

Figure 12B:
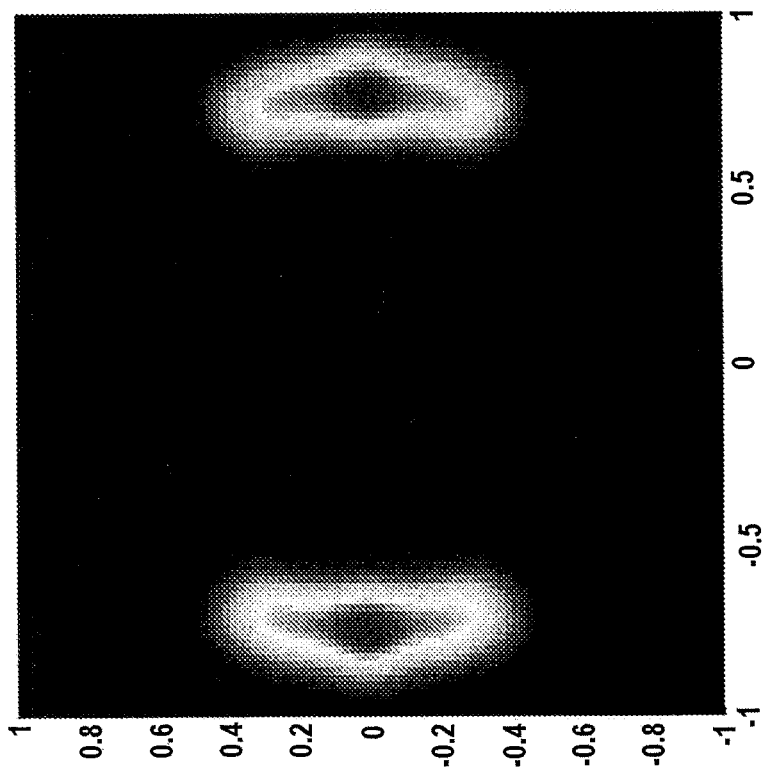
FIG. 12A illustrates an exemplary "Short Brickwall" pattern and FIG. 12B illustrates an illumination source which has been optimized to produce the pattern according to the principles of the present invention.
Figure 12A:
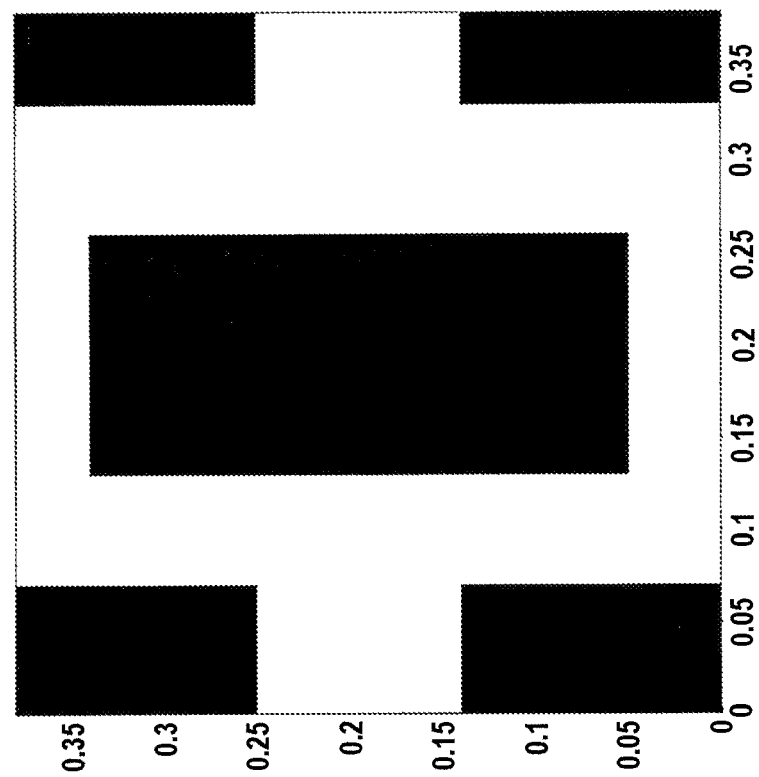

FIGS. 12A and 12B illustrate an exemplary "Short Brickwall" pattern in which the source and the CPL mask have been optimized according to the principles of the present invention. FIG. 12B illustrates an optimum illumination source for the pattern of FIG. 12A which has been obtained according to the principles of the present invention as illustrated in FIG. 2. The source and the CPL mask were optimized for $\lambda/800$ NA=0.8 and 190 nm pitch. Once again, the contrast and the NILS can be observed.

Figures 13A, 13B, 13C:
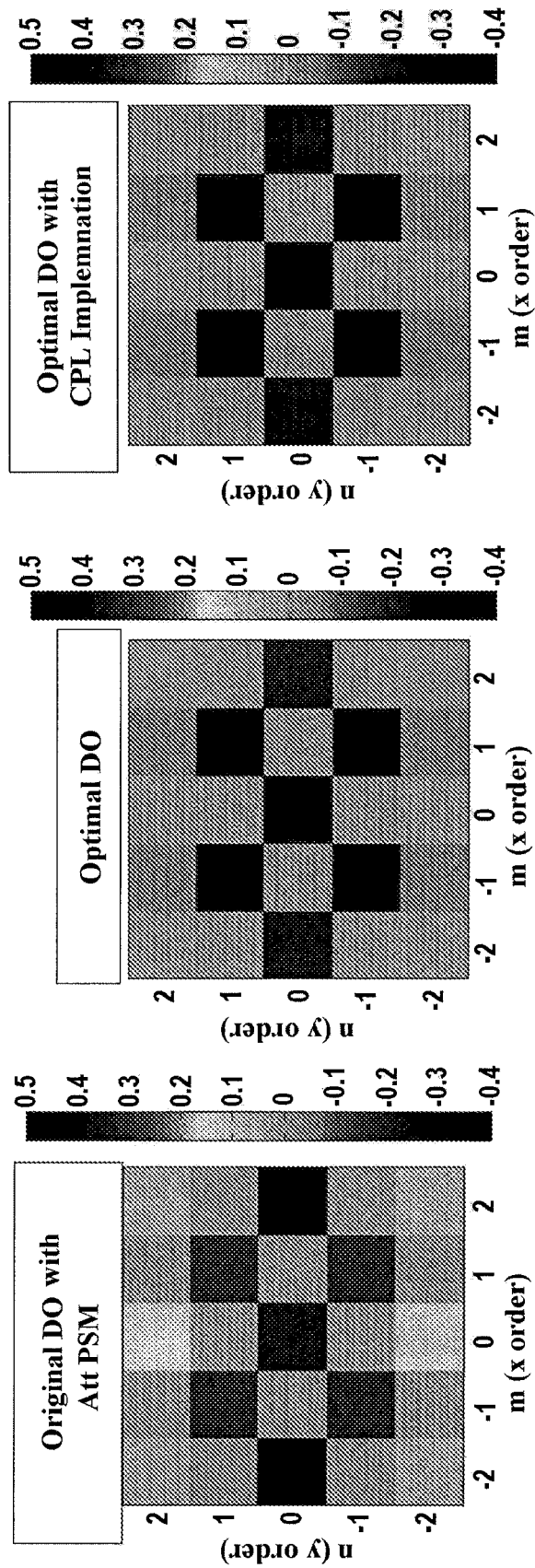
FIGS. 13A-C illustrate the diffraction orders of the exemplary mask in FIG. 12A.

FIGS. 13A-C illustrate the diffraction orders of the exemplary mask in FIG. 12A. FIG. 13A illustrates the original diffraction order with the AttPSM mask, FIG. 13B illustrates the ideal optimal diffraction orders determined according to the process illustrated in FIG. 4 of the present invention. FIG. 13C illustrates an implementation of the optimal diffraction orders with a CPL mask according to the process illustrated in FIG. 4 of the present invention. Those of skill in the art will appreciate that the optimal diffraction orders force more energy into ($\pm 1, \pm 1$) areas. As illustrated by FIGS. 13B and 13C, the CPL mask can represent the optimal diffraction orders almost identically.

Figure 14A:
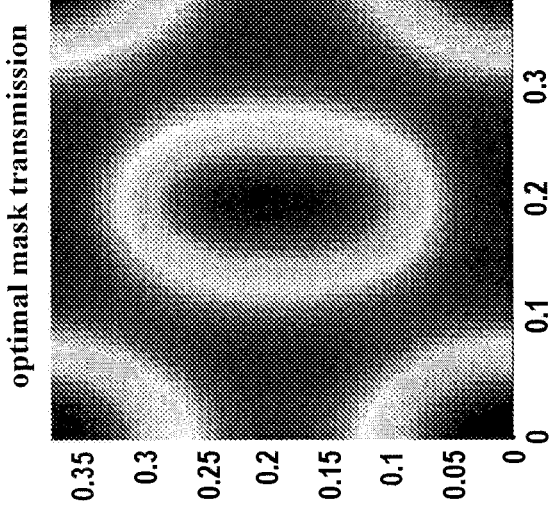
FIGS. 14A-D illustrate the use of primitive edges to create an optimal mask according to the principles of the present invention.
Figure 14B:
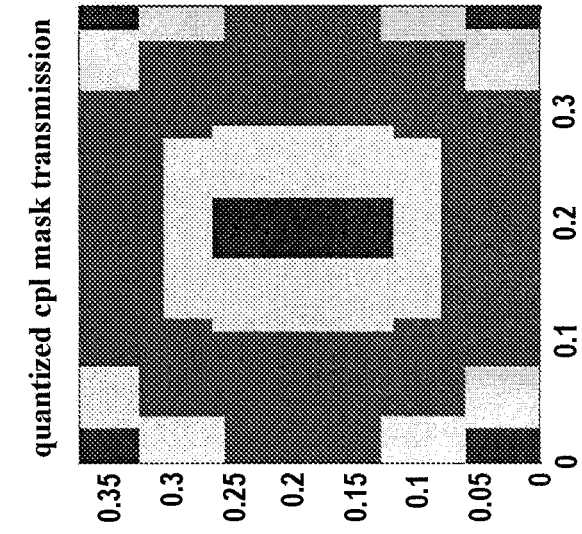
Figure 14C:
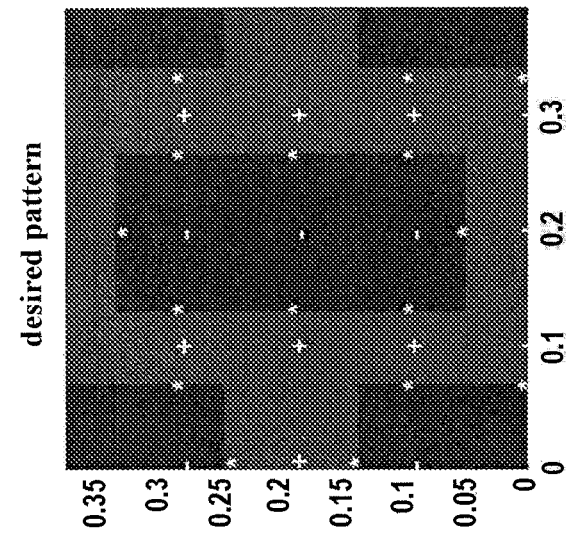
Figure 14D:
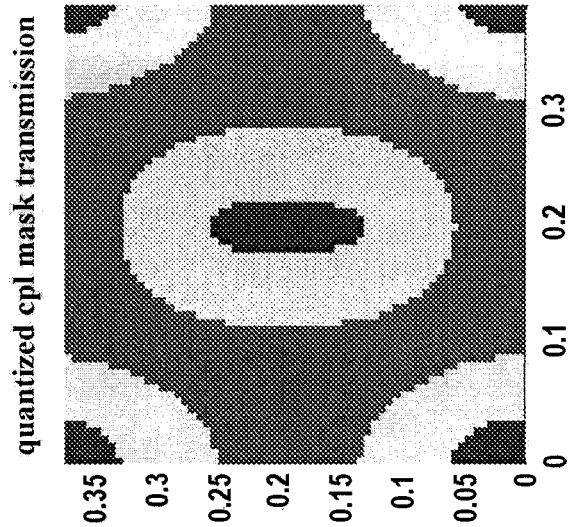

FIGS. 14A-D illustrate the use of primitive edges to create an optimal mask according to the principles of the present invention. FIG. 14A illustrates the exemplary Short Brickwall mask of FIG. 12A. FIG. 14B illustrates the optimal mask transmission of the mask in FIG. 14A. FIG. 14C illustrates using an arcuate modeling technique to map the primitive edges more closely with the optimal mask transmission. FIG. 14D illustrates using primitive rectangles to map the optimal mask transmission. As illustrated by FIGS. 14C and 14D, two CPL implementations may lead to substantially the same diffraction order spectrum. Primitive edges are not critical but using primitives may lead to a smaller figure count and possibly allow an easier inspection of the mask.

Figure 15A:
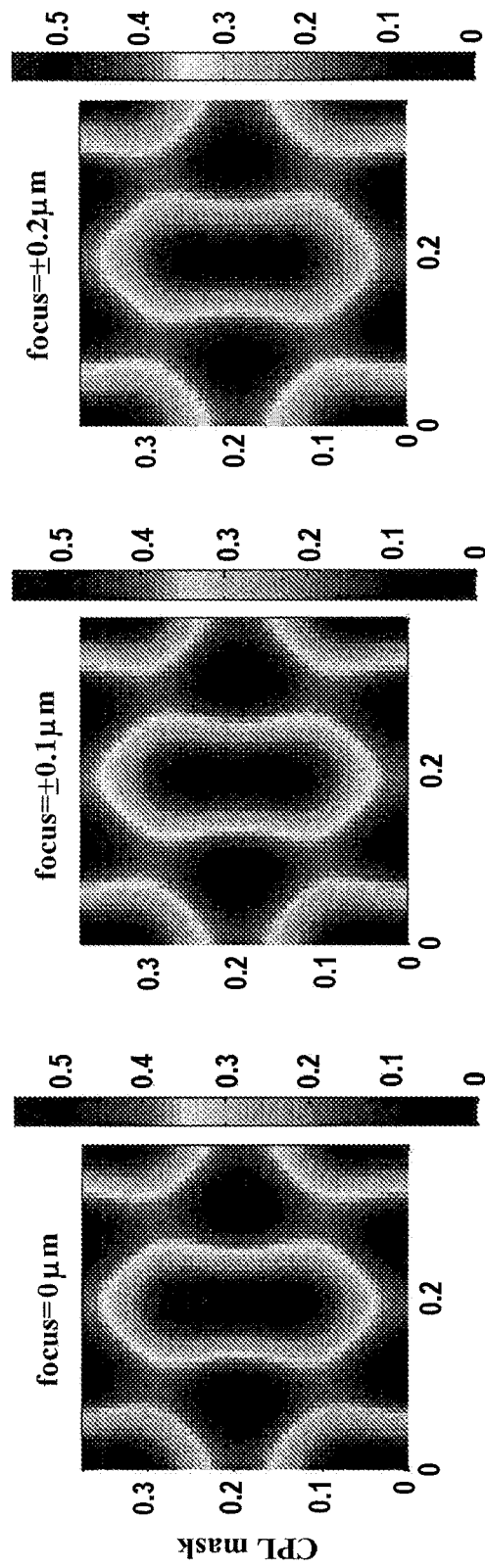
FIGS. 15A and 15B illustrate aerial image comparisons using the Short Brickwall pattern of FIG. 12A in a CPL mask and an AttPSM mask.
Figure 15B:
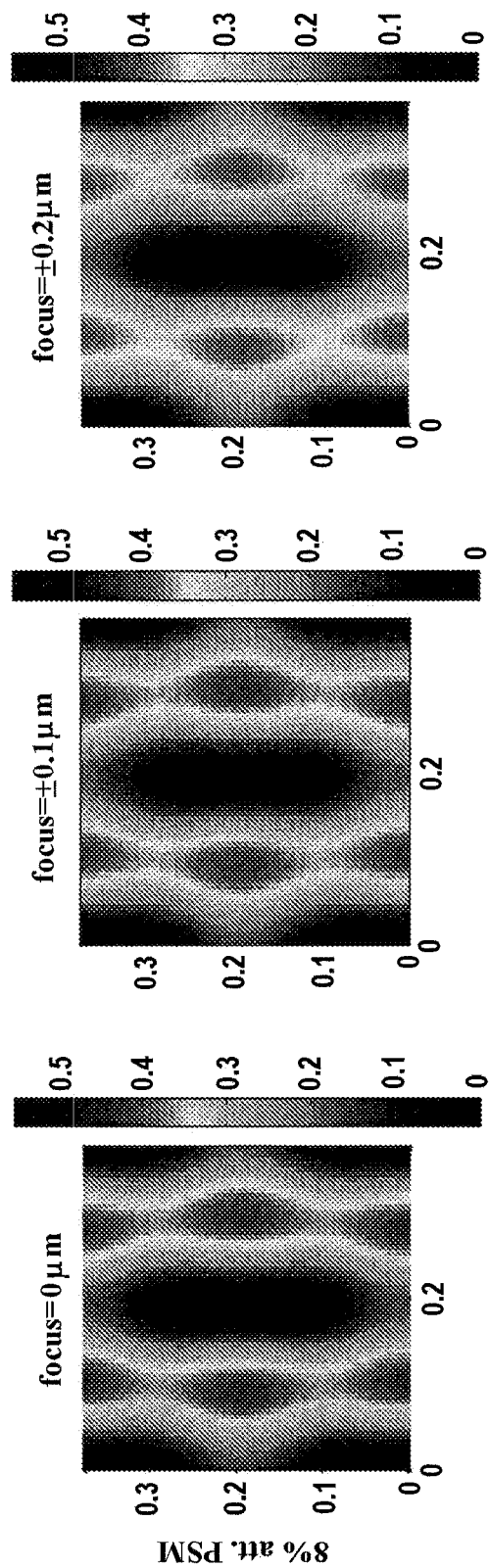

FIGS. 15A-17B illustrate aerial image comparisons using the Short Brickwall of FIG. 12A. In FIG. 15, a CPL mask and an 8% AttPSM mask are both exposed with dipole illumination. As seen in FIGS. 15A and 15B, the contrast and NILS is much better in between the lines and the end of the line with CPL than the PSM mask. The CPL mask has production worthy process margins while the 8% solution does not appear to be as favorable. As also illustrated in FIGS. 15A and 15B, the CPL mask maintains the area better than 8% AttPSM.

Figure 16A:
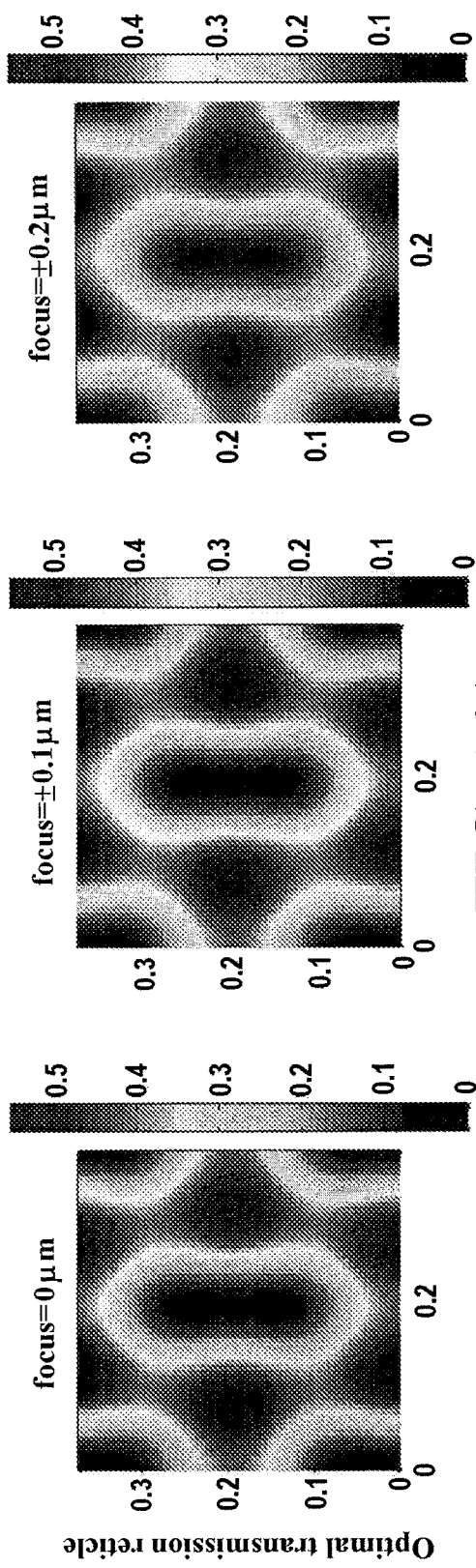
FIGS. 16A and 16B illustrate the trade-off between obtaining an optimal transmission and using a CPL mask.
Figure 16B:
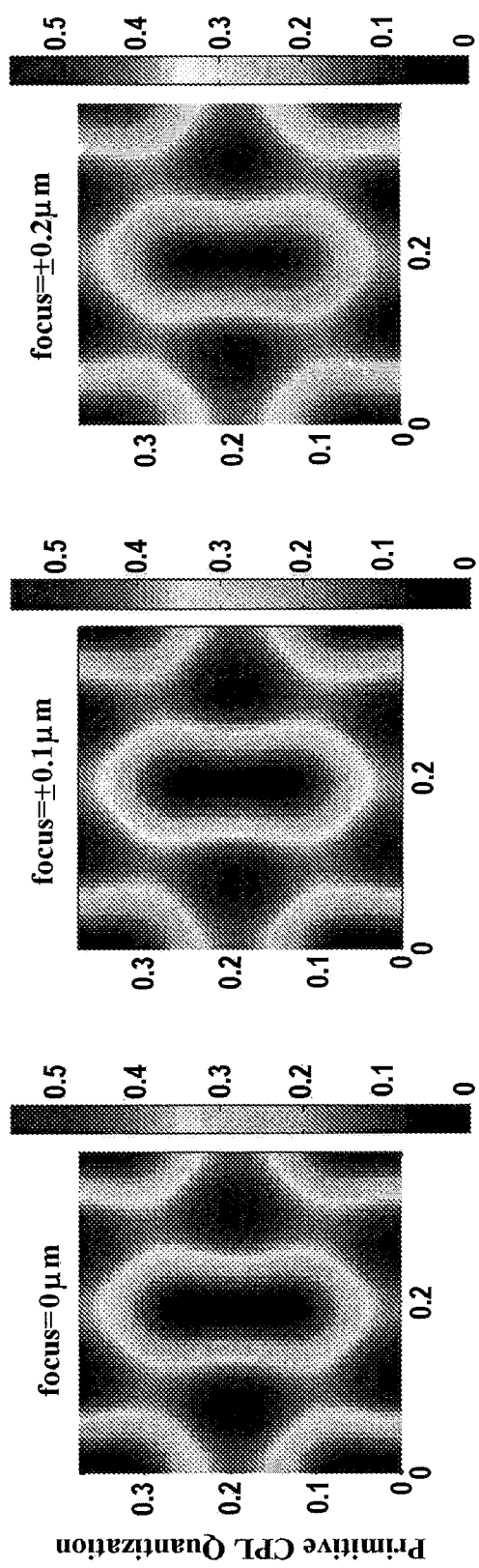

FIGS. 16A and 16B illustrate the trade-off between obtaining an optimal transmission and using a CPL mask. As illustrated by FIGS. 16A and 16B, there is almost no difference between optimal transmission and CPL representation. Hence, the CPL mask offers a favorable solution for mask optimization according to the principles of the present invention.

Figure 17A:
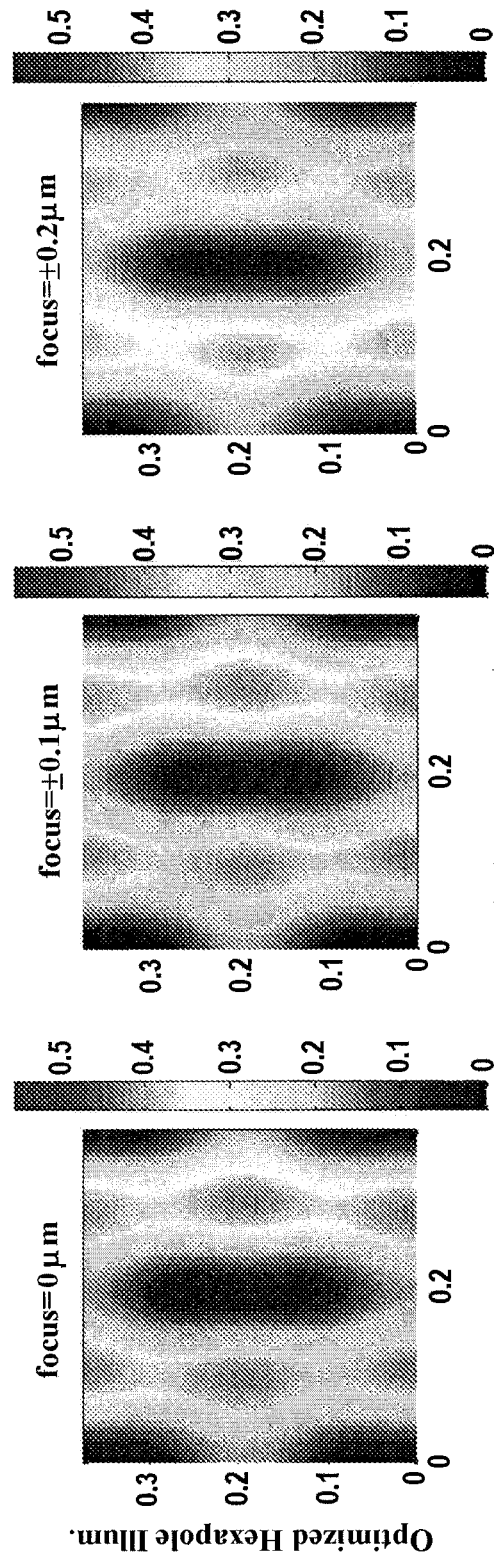
FIGS. 17A and 17B illustrate aerial image comparisons between an 8% AttPSM exposed with a dipole illumination in the top row and an annular illumination in the bottom row.
Figure 17B:
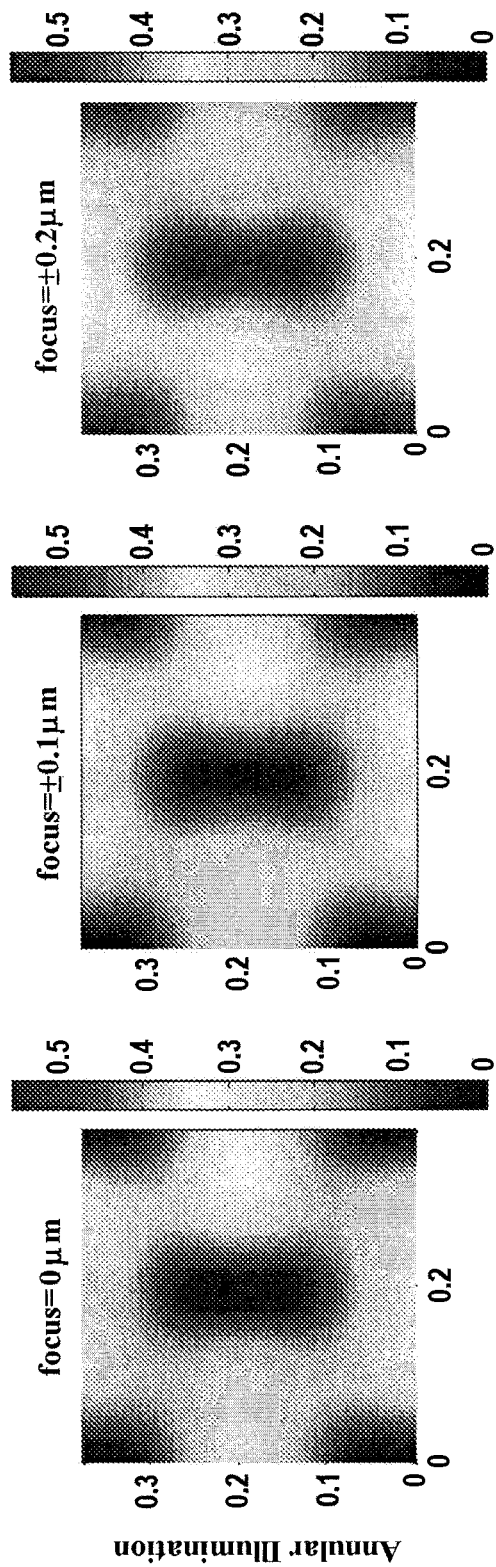

FIG. 17A illustrates aerial image comparisons between an 8% AttPSM exposed with dipole illumination and FIG. 17B illustrates using annular illumination. As shown in FIGS. 17A and 17B, the NILS is better with dipole illumination in comparison to annular illumination. Annular illumination has better NILS at the end of line (EOL). However, the NILS probably is not large enough with annular illumination to print bricks without bridging.

Figure 18B:
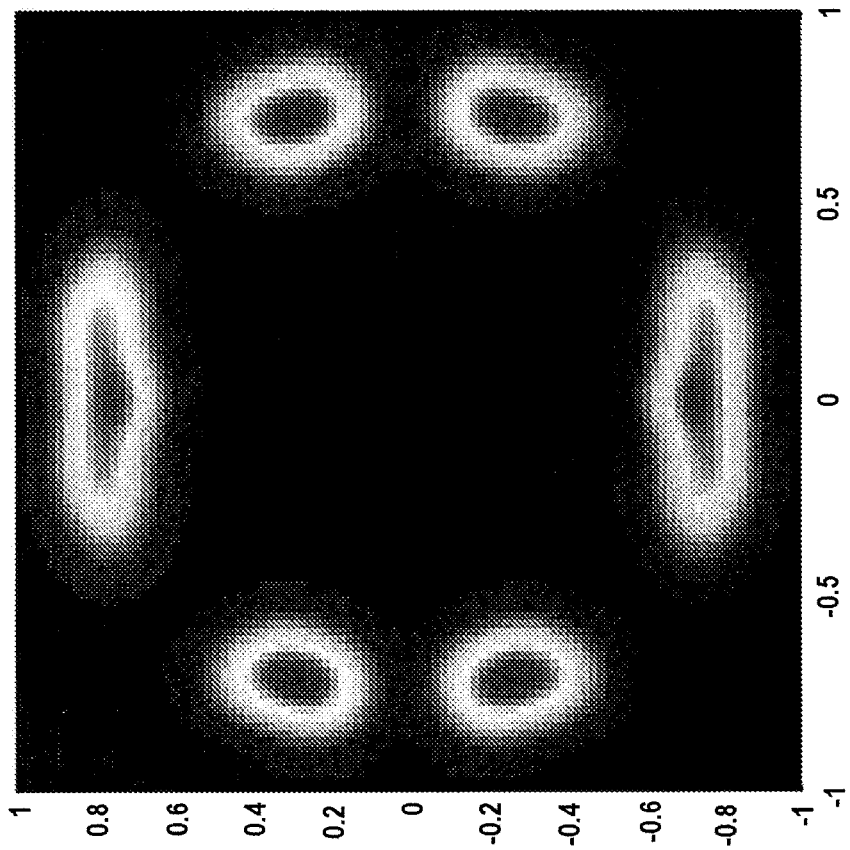
FIG. 18A illustrate the principles of the present invention as applied to a rectangular contact array mask and FIG. 18B illustrates an illumination source which has been optimized to illuminate the pattern of FIG. 18A in accordance with the present invention.
Figure 18A:
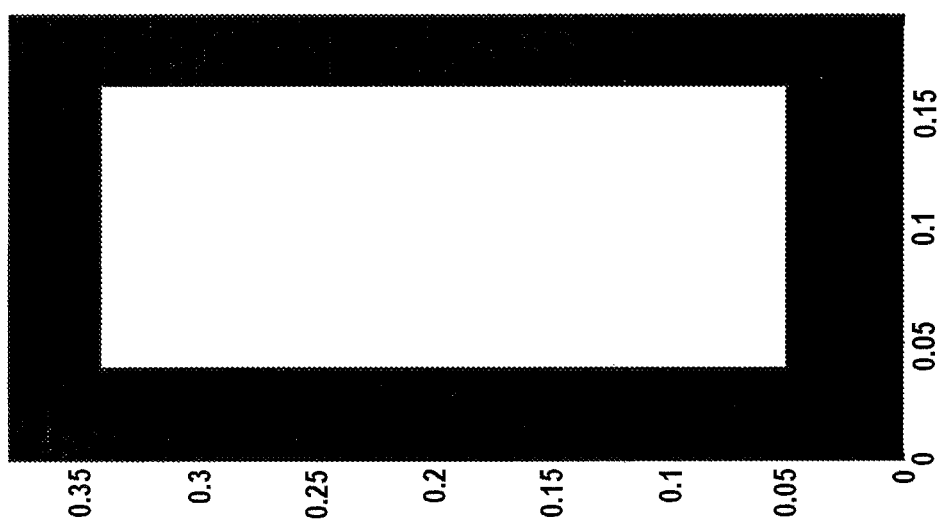

FIGS. 18A-23B illustrate the principles of the present invention as applied to a rectangular contact array mask, depicted in FIG. 18A. In FIGS. 18A and 18B, with the source and the CPL Mask optimized for $\lambda 800$ NA=0.8 and 190 nm pitch. Once again, the contrast and the NILS can be observed.

FIGS. 19A-C illustrate the diffraction orders of the exemplary mask in FIG. 18A. FIG. 19A illustrates the original diffraction order with the AttPSM mask, FIG. 19B illustrates the optimal diffraction order determined by the principles of the present invention, and FIG. 19C illustrates the optimal diffraction order implemented with a CPL mask. Those of skill in the art will appreciate that the optimal diffraction orders force more energy into the higher orders ($\pm 1, 0$), $(0, \pm 1)$, and $(0, \pm 2)$. As illustrated by FIGS. 19B and 19C, the CPL mask can represent the optimal diffraction orders almost identically.

Figures 20A, 20B, 20C:
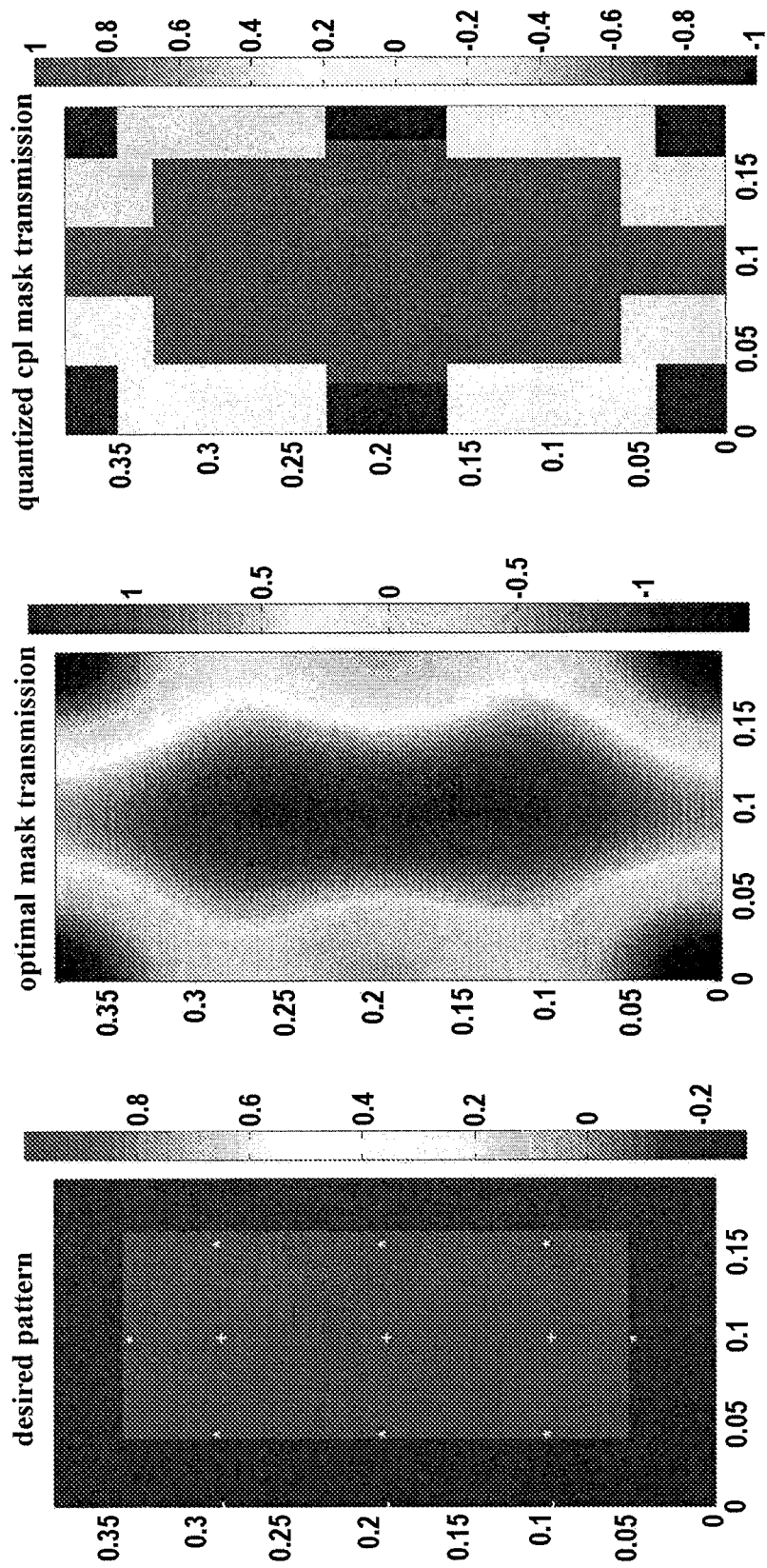
FIGS. 20A-C illustrate the use of primitive edges to create a quantized CPL mask according to the principles of the present invention.

FIGS. 20A-C illustrate the use of primitive edges to create a quantized CPL mask according to the principles of the present invention. FIG. 20A illustrates the exemplary Rectangular Contact Array mask of FIG. 19A. FIG. 20B illustrates the optimal mask transmission of the mask in FIG. 20A. FIG. 20C illustrates using primitive rectangles to map the optimal mask transmission to create a quantized CPL mask.

Figure 21A:
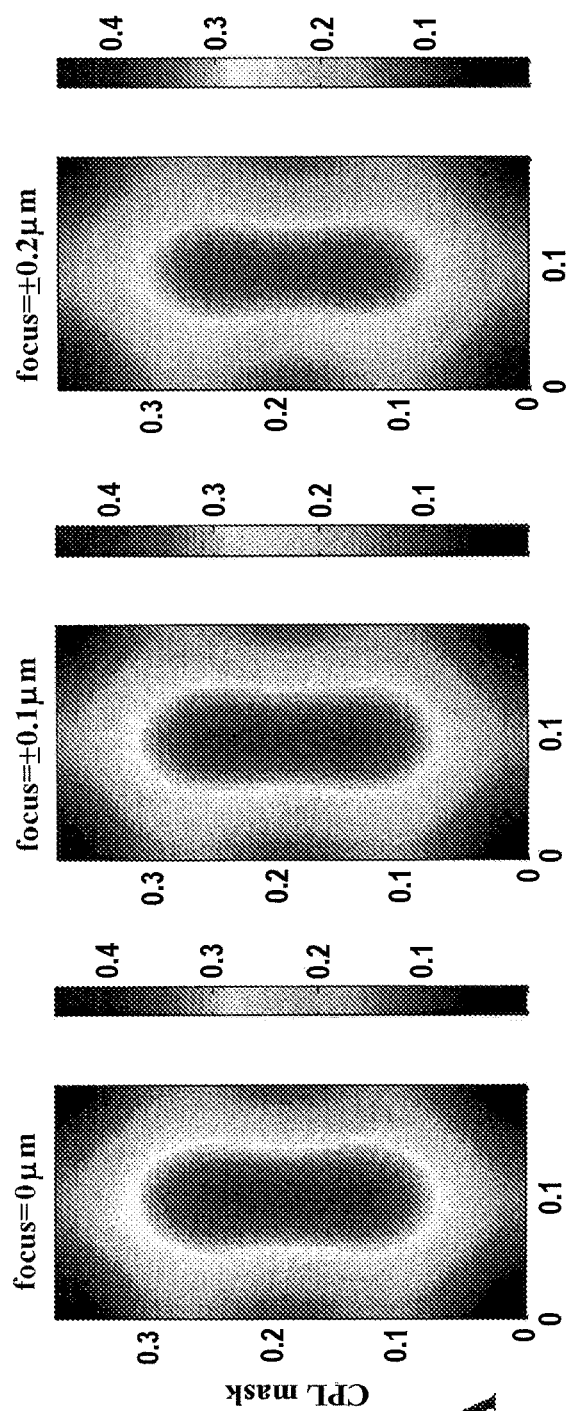
FIGS. 21A and 21B illustrate an aerial image comparison using the rectangular contact array mask of FIG. 19A.
Figure 21B:
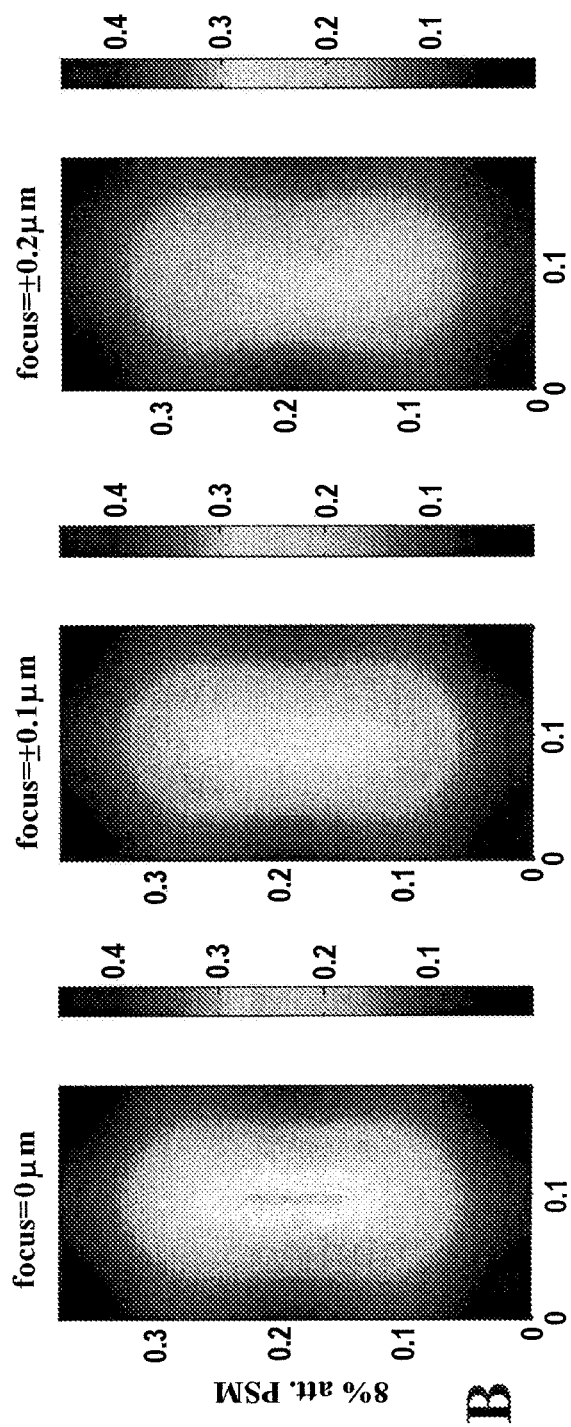

FIGS. 21A-23B illustrate aerial image comparisons using the Rectangular Contact Array mask of FIG. 19A. In FIG. 21A, a CPL mask and in FIG. 21B an 8% AttPSM mask are both exposed with hexapole illumination. As seen in FIGS. 21A and 21B, the peak intensity and NILS are better with the CPL mask. The CPL mask has production worthy DOF (depth of focus) while the 8% AttPSM solution does not appear to have sufficient DOF to be as favorable. As also illustrated in FIGS. 21A and 21B, the CPL mask maintains the area better than the 8% AttPSM.

Figure 22A:
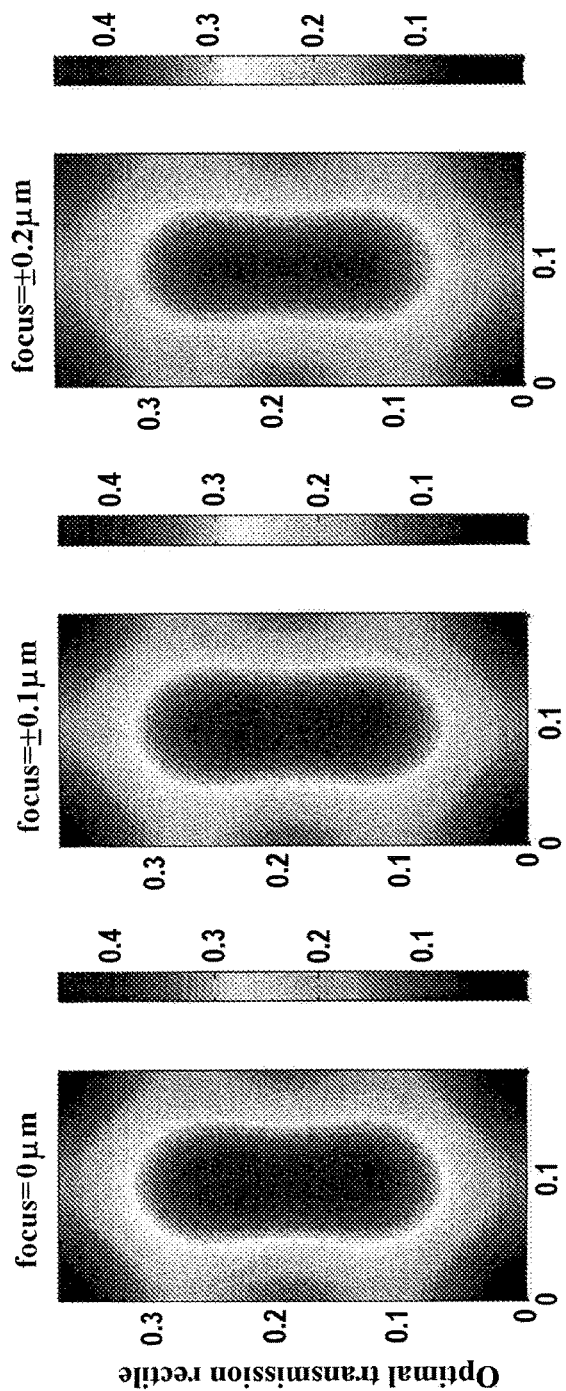
FIGS. 22A and 22B illustrate the trade-off between obtaining an optimal transmission and using a CPL mask.
Figure 22B:
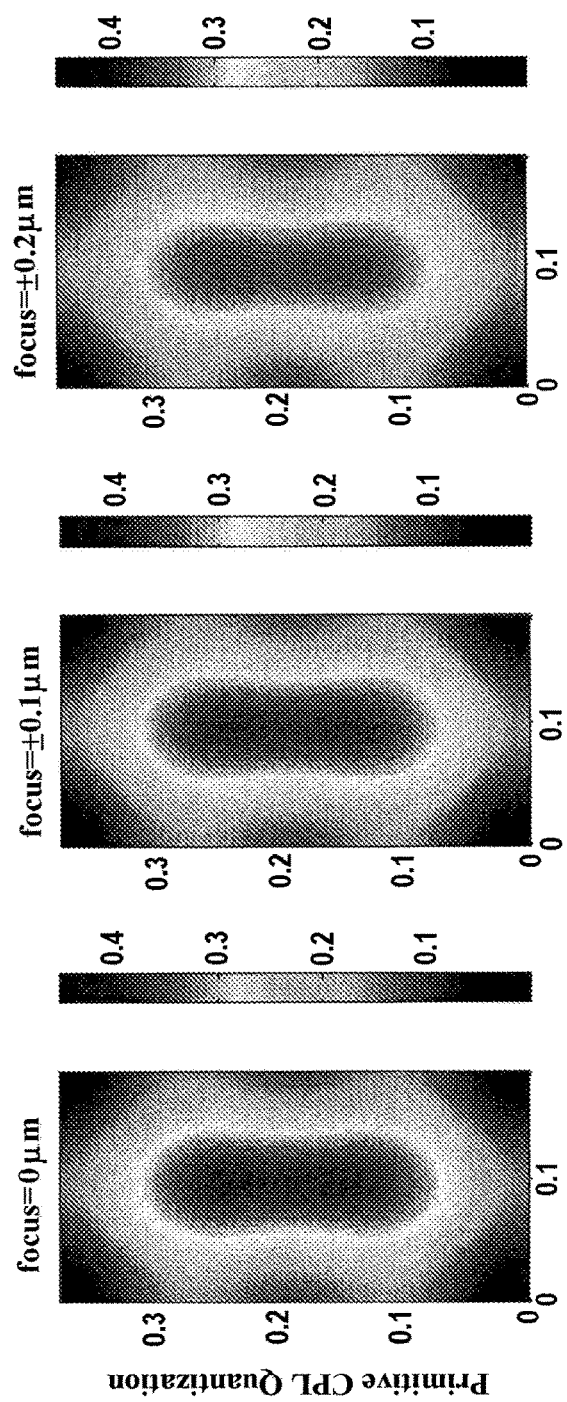

FIGS. 22A and 22B illustrate a trade-off between obtaining an optimal transmission and using a CPL mask. As illustrated by FIGS. 22A and 22B, there appears to be a slightly better NILS with optimal transmission reticle in comparison to CPL.

Figure 23A:
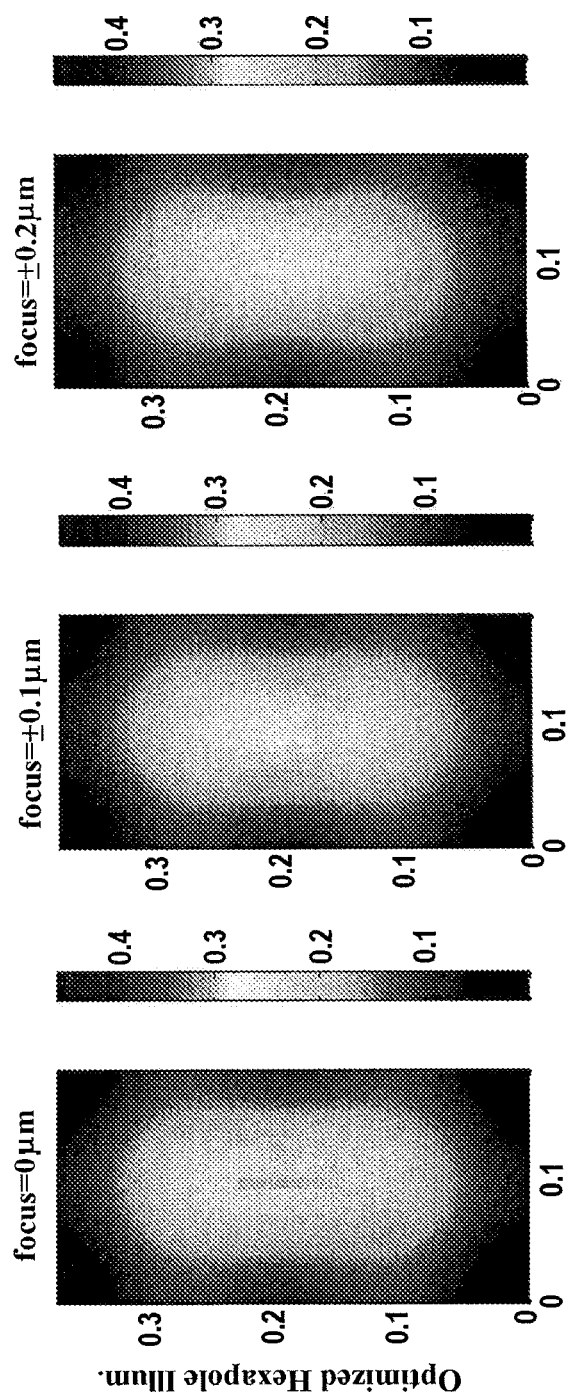
FIGS. 23A and 23B illustrate aerial image comparisons between an 8% AttPSM exposed with dipole illumination in the top row and annular illumination in the bottom row.
Figure 23B:
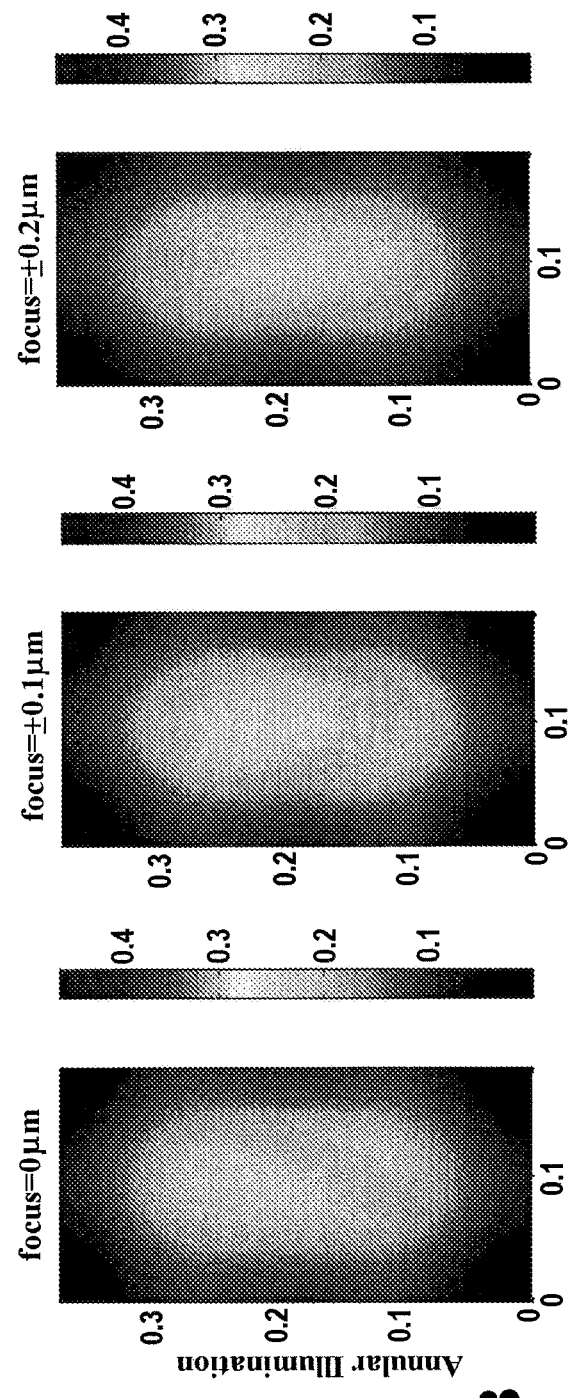

FIGS. 23A and 23B illustrate aerial image comparisons between an 8% AttPSM exposed with dipole illumination in the top row and annular illumination in the bottom row. As shown in FIGS. 23A and 23B, the peak intensity and NILS are better with hexapole illumination in comparison to annular illumination. The peak intensity with annular illumination may not be sufficient to print through focus.

FIGS. 24A-29B illustrate the principles of the present invention as applied to a Staggered Rectangular Contact Array, depicted in FIG. 24A. FIGS. 24A and 24B illustrate an exemplary Staggered Rectangular Contact Array mask in which the source and CPL mask have been optimized according to the principles of the present invention. In FIGS. 24A and 24B, the source and CPL Mask were optimized for λ/800, NA=0.8 and 190 nm pitch. Once again, the contrast and the NILS can be observed.

Figures 25A, 25B, 25C:
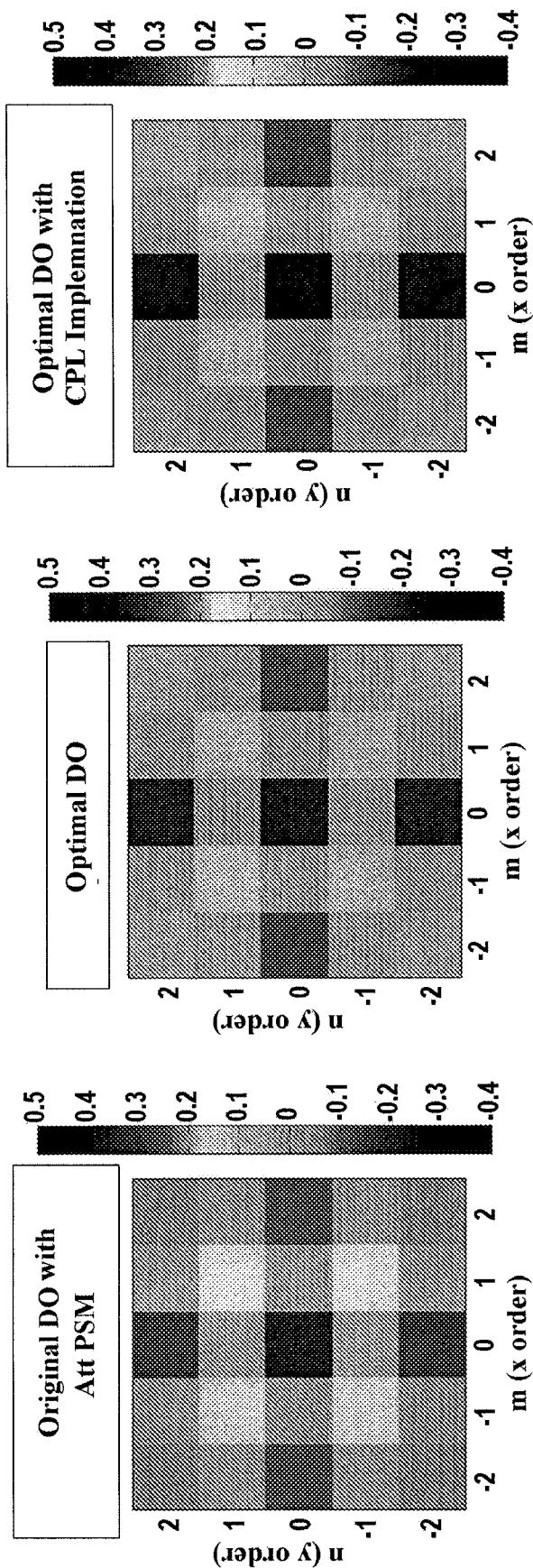
FIGS. 25A-C illustrate the diffraction orders of the exemplary mask in FIG. 24A.

FIGS. 25A-C illustrate the diffraction orders of the exemplary mask in FIG. 24A. FIG. 25A illustrates the original diffraction order with the AttPSM mask, FIG. 25B illustrates the optimal diffraction order determined by the principles of the present invention, and FIG. 25C illustrates the optimal diffraction order with a CPL implementation. Those of skill in the art will appreciate that the optimal diffraction orders force more energy into (0,±2) and (±1,±1) areas. As illustrated by FIGS. 25B and 25C, the CPL mask can represent the optimal diffraction orders almost identically.

FIGS. 26A-C illustrate the use of primitive edges to create a quantized CPL mask according to the principles of the present invention. FIG. 26A illustrates the exemplary Staggered Rectangular Contact Array mask of FIG. 24A. FIG. 26B illustrates the optimal mask transmission of the mask in FIG. 24A. FIG. 26C illustrates using primitive rectangles to map the optimal mask transmission to create a quantized CPL mask. In FIGS. 26A-C, 180 degree outriggers may be used at the sides of the contact array.

Figure 27A:
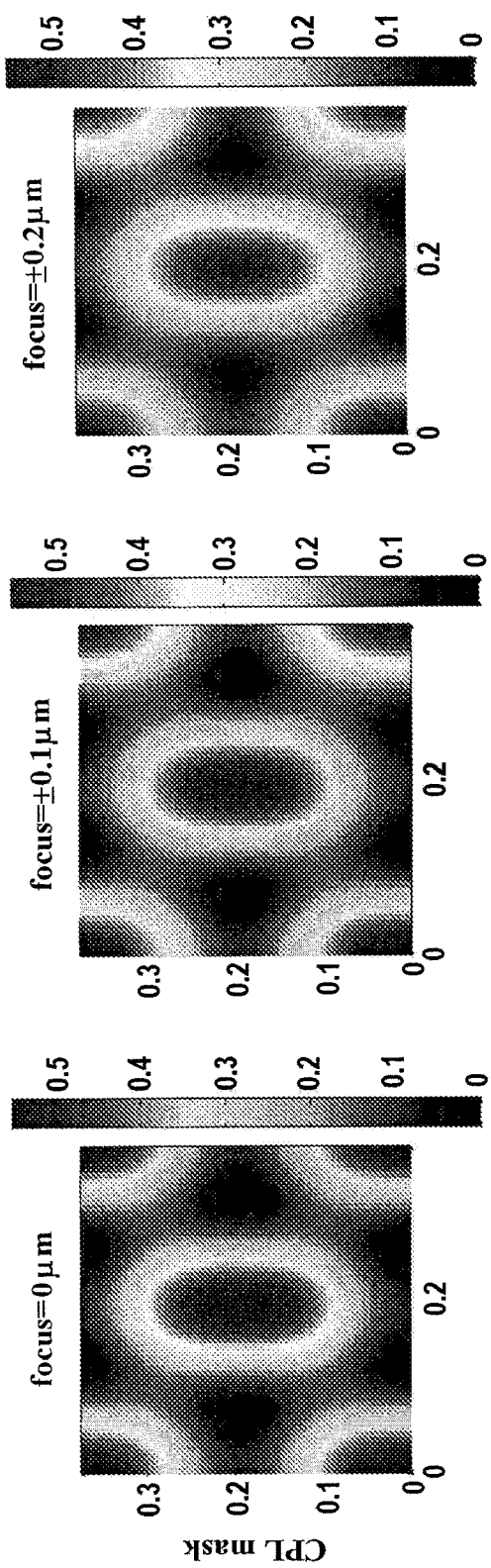
FIGS. 27A and 27B illustrate aerial image comparisons using a CPL mask and an AttPSM mask.
Figure 27B:
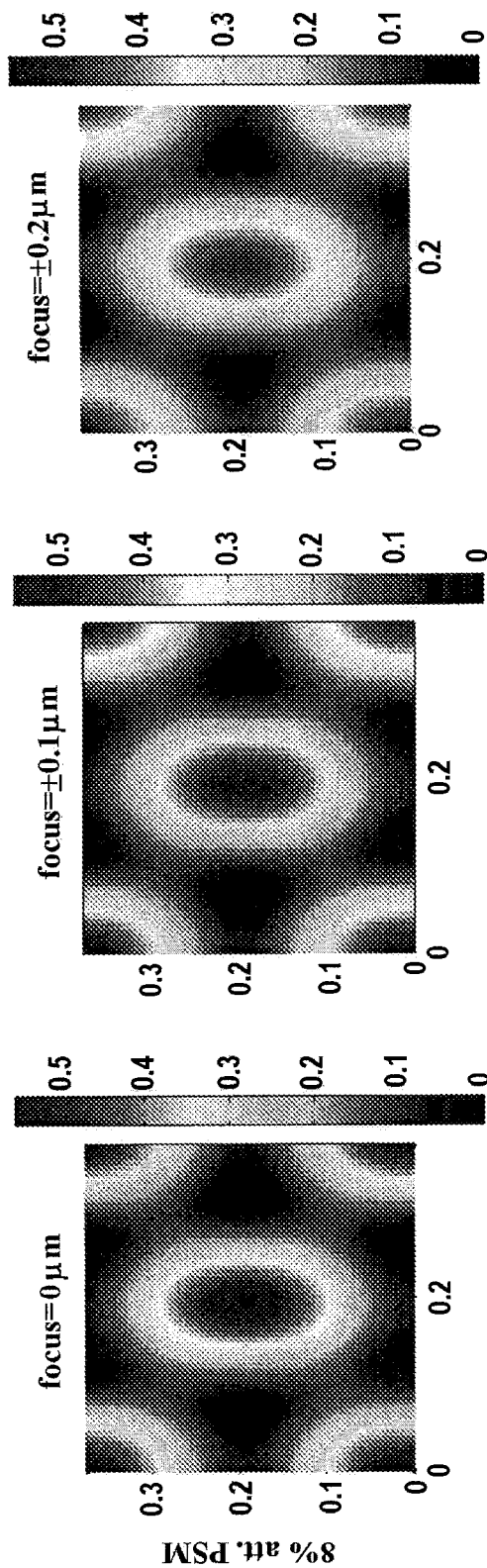

FIGS. 27A-29B illustrate aerial image comparisons using the Rectangular Contact Array mask of FIG. 24A. In FIGS. 27A and 27B, a CPL mask and an 8% AttPSM, respectively, mask are both exposed with quad illumination. As seen in FIGS. 27A and 27B, the peak intensity and NILS are better with the CPL mask than the PSM mask. The CPL mask also has a greater exposure latitude and DOF in comparison to the 8% AttPSM mask.

FIGS. 28A and 28B illustrate the trade-off between obtaining an optimal transmission and using a CPL mask. As illustrated by FIGS. 28A and 28B, there is almost no difference between optimal transmission and the CPL mask representation. The CPL mask offers a favorable solution for mask optimization according to the principles of the present invention.

Figure 29A:
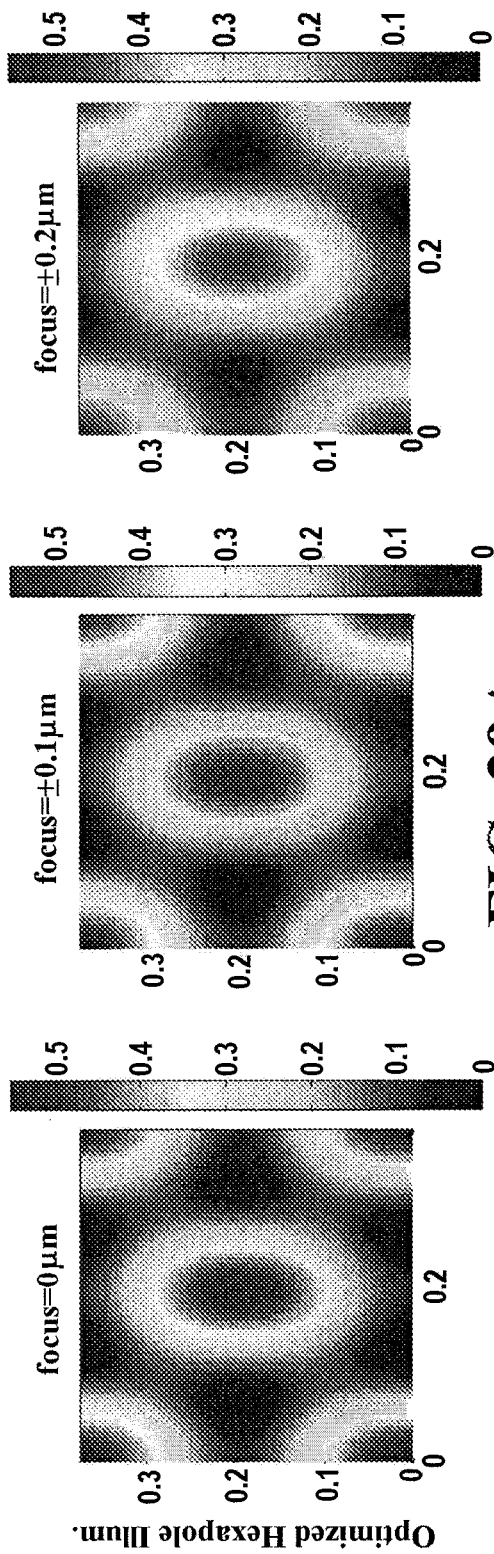
FIGS. 29A and 29B illustrate aerial image comparisons between an 8% AttPSM exposed with quad in the top row and annular illumination in the bottom row.
Figure 29B:
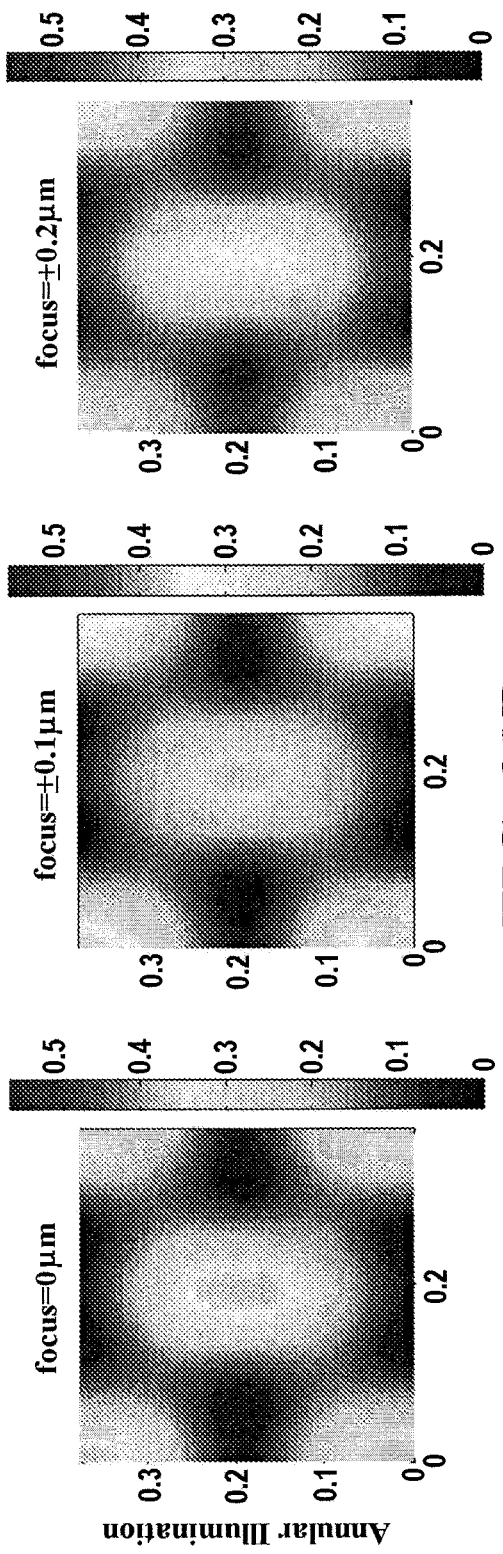

FIGS. 29A and 29B illustrate aerial image comparisons between an 8% AttPSM exposed with quad illumination in the top row and annular illumination in the bottom row. As shown in FIGS. 29A and 29B, the peak intensity and NILS are better with quad illumination than annular illumination. The peak intensity with annular illumination may not be sufficient to print through focus.

Figure 30:
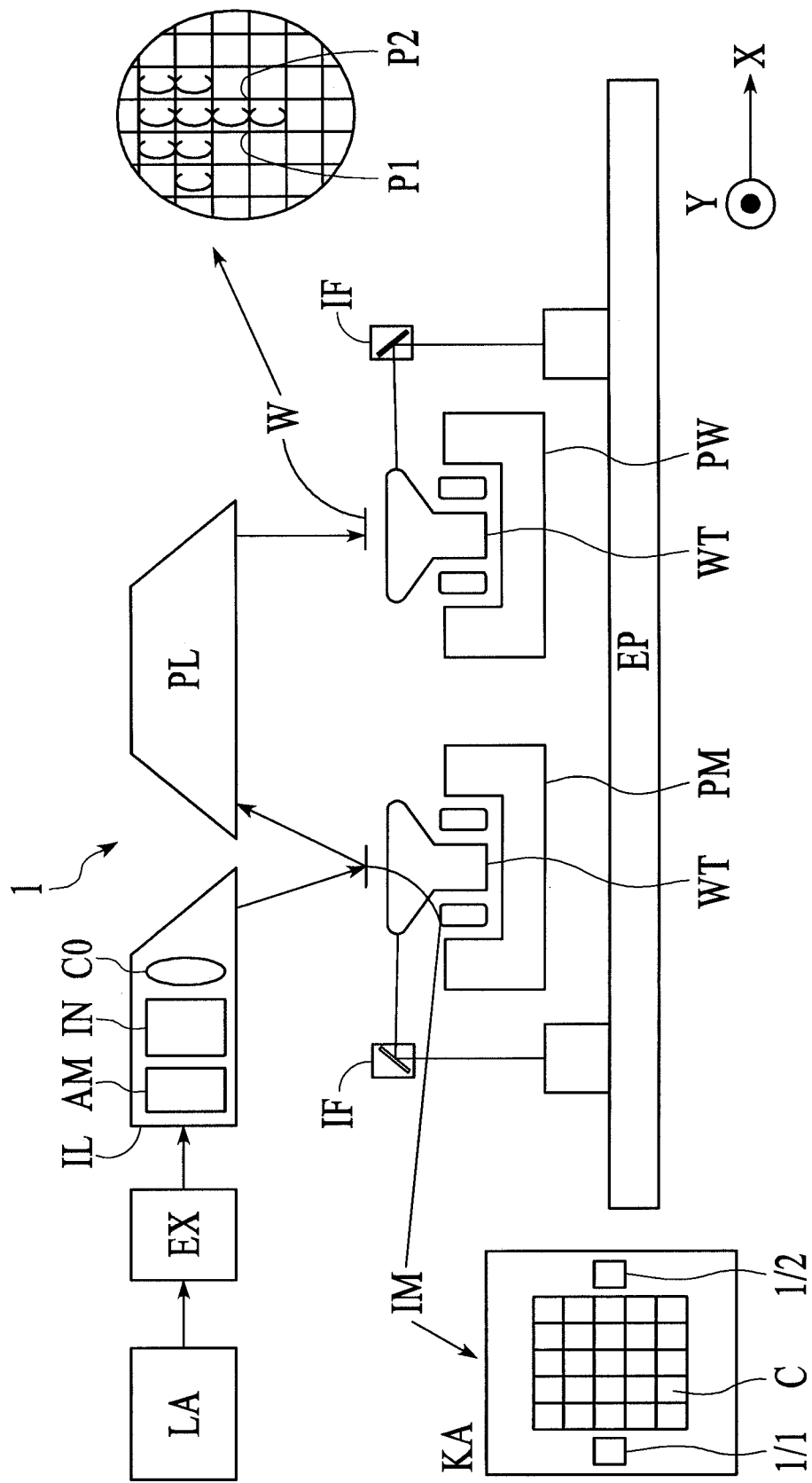
FIG. 30 schematically depicts a lithographic projection apparatus suitable for use with a mask designed with the aid of the current invention.

FIG. 30 schematically depicts a lithographic projection apparatus 1 suitable for use with a mask designed with the aid of the current invention. The apparatus comprises:
  a radiation system Ex, IL, for supplying a projection beam PB of radiation. In this particular case, the radiation system also comprises a radiation source LA;
  a first object table (mask table) MT provided with a mask holder for holding a mask MA (e.g. a reticle), and connected to first positioning means for accurately positioning the mask with respect to item PL;
  a second object table (substrate table) WT provided with a substrate holder for holding a substrate W (e.g. a resist-coated silicon wafer), and connected to second positioning means for accurately positioning the substrate with respect to item PL;
  a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 30 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The illumination source intensity may also be made with a mirror array or an LCD. The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 27. However, in the case of a wafer stepper (as opposed to a step-and-scan tool) the mask table MT may just be connected to a short stroke actuator, or may be fixed.

The depicted tool can be used in two different modes:
  In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
  In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media and volatile media. Non-volatile media include, for example, optical or magnetic disks, such as any of the storage devices in any computer(s) operating as one of the server platform, discussed above. Volatile media include dynamic memory, such as main memory of such a computer platform. Common forms of computer-readable media therefore include, for example: a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read programming code and/or data. Many of these forms of computer readable media may be involved in carrying one or more sequences of one or more instructions to a processor for execution.

Figure 31:
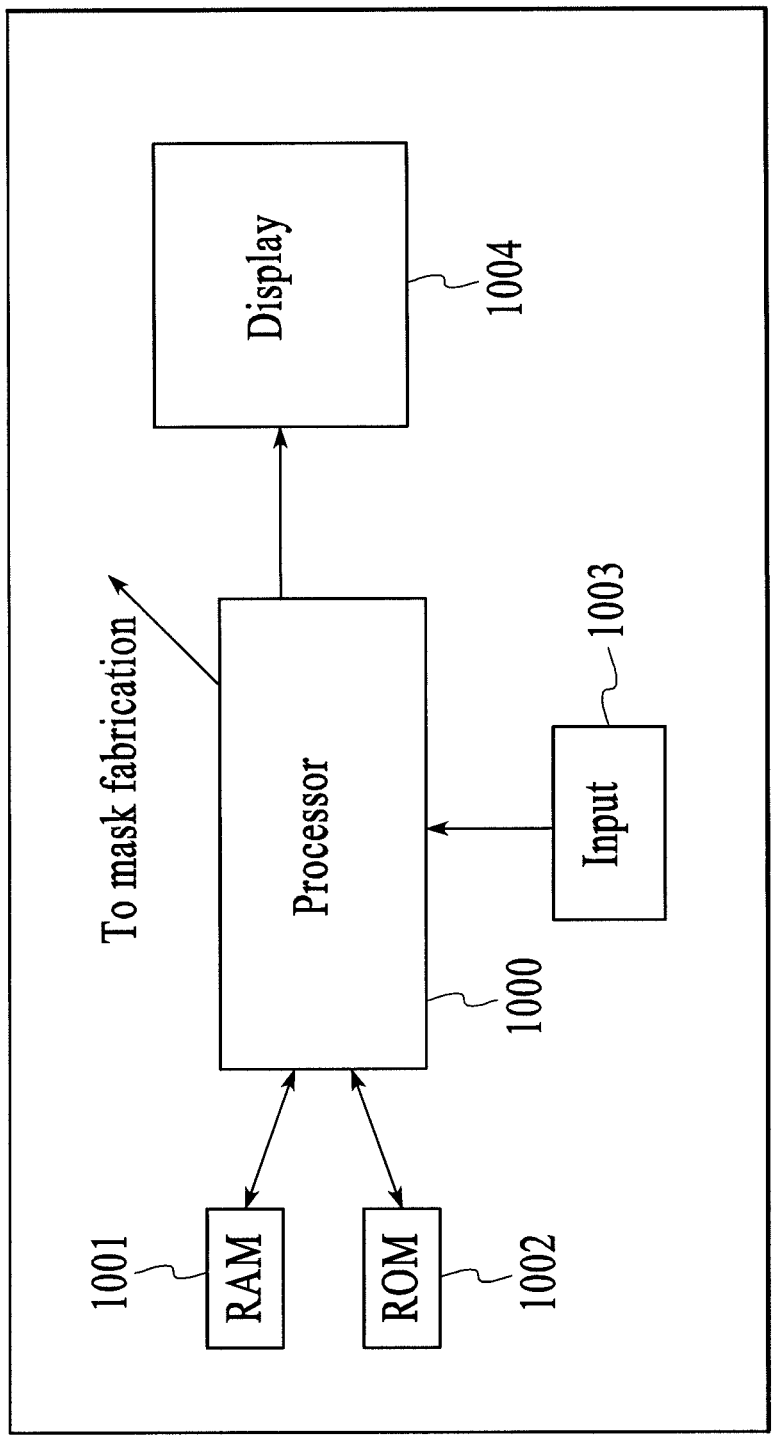
FIG. 31 illustrates an exemplary mask optimization processing unit in accordance with the present invention.

As illustrated in FIG. 31, an exemplary mask optimization unit may contain a processor 1000 which receives input from an input unit 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the processing illustrated in FIGS. 2-6, and stores information on RAM 1001. The calculated results of processor 1000 may be displayed on display 1004 and may be provided to a mask fabrication unit.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for obtaining a lithographic process for creating an image of a pattern at an image plane using a patterning device, the method comprising:
   by a hardware computer system,
   based on intensities determined for the subset of diffraction orders, selecting one or more illumination points in an illumination system and determining a transmission mask for the pattern, for which minimum image log slope is maximized in the image at each of a plurality of points, wherein determining the transmission mask comprises determining mask diffraction orders, and determining mask diffraction orders comprises performing a non-linear optimization to find optimal diffraction orders, and
   performing a linear optimization by selecting quantized mask transmission to match the optimal diffraction orders,
   where the (a) illumination points, (b) the transmission mask, and/or (c) information derived from (a) and/or (b), is configured to design, control and/or modify the physical lithographic process involving the pattern and/or design, control and/or modify a physical object or apparatus to be used in the physical lithographic process.

2. The method of claim 1, wherein determining the transmission mask comprises determining mask diffraction orders in a spatial frequency domain.

3. The method of claim 1, wherein determining the mask diffraction orders is performed in one or both of horizontal and vertical directions of the pattern.

4. The method of claim 1, wherein determining the mask diffraction orders includes determining magnitudes and phases of the mask diffraction orders.

5. The method of claim 1, further comprising determining one or both of a minimum pupil fill and minimum ring width using specifications of an actual illumination system of the lithographic process.

6. The method of claim 1, comprising selecting one or more illumination points in the illumination system and determining a transmission mask for the pattern, for which an intensity is a specified value or within a specified range.

7. The method of claim 1, further comprising selecting, based on a calculation involving a value of a wavelength of radiation and a value representing an extent of distribution of a beam of the radiation from a radiation source for illuminating the pattern, a subset of diffraction orders.

8. A non-transitory computer-readable storage medium having stored instructions therein, the instructions, upon execution by a computer system, configured to cause the computer system to at least:
based on intensities determined for the subset of diffraction orders, select one or more illumination points in an illumination system and determine a transmission mask for a pattern to be imaged to an image plane in a lithographic process using a patterning device, for which minimum image log slope is maximized in the image at each of a plurality of points, wherein determination of the transmission mask comprises determination of mask diffraction orders, and determination of mask diffraction orders comprises performance of a non-linear optimization to find optimal diffraction orders, and
perform a linear optimization by selecting quantized mask transmission to match the optimal diffraction orders,
where the (a) illumination points, (b) the transmission mask, and/or (c) information derived from (a) and/or (b), is configured to design, control and/or modify the physical lithographic process involving the pattern and/or design, control and/or modify a physical object or apparatus to be used in the physical lithographic process.

9. The non-transitory computer-readable storage medium of claim 8, wherein the instructions configured to determine the transmission mask are further configured to determine mask diffraction orders in a spatial frequency domain.

10. The non-transitory computer-readable storage medium of claim 8, wherein the determination of the mask diffraction orders is performed in one or both of horizontal and vertical directions of the pattern.

11. The non-transitory computer-readable storage medium of claim 8, wherein the determination of the mask diffraction orders includes determination of magnitudes and phases of the mask diffraction orders.

12. The non-transitory computer-readable storage medium of claim 8, wherein the instructions are further configured to determine one or both of a minimum pupil fill and minimum ring width using the specifications.

13. The non-transitory computer-readable storage medium of claim 8, wherein instructions are further configured to perform the selection of the one or more illumination points in the illumination system and determination of the transmission mask for the pattern, for which an intensity is a specified value or within a specified range.

14. The non-transitory computer-readable storage medium of claim 8, wherein the instructions are further configured to cause the computer system to select, based on a calculation involving a value of a wavelength of radiation and a value representing an extent of distribution of a beam of the radiation from a radiation source for illuminating the pattern, a subset of diffraction orders.

15. A method for obtaining a lithographic process for creating an image of a pattern at an image plane using a patterning device, the method comprising:
identifying fragmentation points; and
by a hardware computer system, selecting one or more illumination points in an illumination system and determining a mask configuration for the pattern, by using a non-linear optimization in a spatial frequency domain, by using kernels derived from diagonalization of transmission cross coefficients of the lithographic process and for which minimum image log slope is maximized in the image at each of the fragmentation points,
where the (a) illumination points, (b) the mask configuration, and/or (c) information derived from (a) and/or (b), is configured to design, control and/or modify the physical lithographic process involving the pattern and/or design, control and/or modify a physical object or apparatus to be used in the physical lithographic process.

16. The method of claim 15, wherein determining the mask configuration comprises determining mask diffraction orders in the spatial frequency domain.

17. The method of claim 16, wherein determining the mask diffraction orders is performed in one or both of horizontal and vertical directions of the pattern.

18. The method of claim 16, wherein determining the mask diffraction orders includes determining magnitudes and phases of the mask diffraction orders.

19. The method of claim 15, comprising:
performing the non-linear optimization to find optimal diffraction orders; and
performing a linear optimization by selecting quantized mask transmission to match the optimal diffraction orders.

20. The method of claim 15, further comprising determining one or both of a minimum pupil fill and minimum ring width using specifications of the illumination system.

21. The method of claim 15, wherein determining the mask configuration comprises:
locating areas of maximum transmission and minimum transmission,
assigning a primitive area as an area centered on an area of maximum transmission or minimum transmission, and
varying edges of the primitive area to match optimum diffraction orders,
wherein the primitive area has a minimum size which is substantially equal to a minimum feature size of a patterning device to implement the pattern.

22. The method of claim 15, comprising selecting the one or more illumination points in the illumination system and determining the mask configuration for the pattern, for which an intensity is a specified value or within a specified range.

23. A non-transitory computer-readable storage medium having stored instructions therein, the instructions, upon execution by a computer system, configured to cause the computer system to at least:
identifying fragmentation points; and
select one or more illumination points in an illumination system and determine a mask configuration for a pattern to be imaged using a lithographic process for creating an image of the pattern using a patterning device, by using a non-linear optimization in a spatial frequency domain, by using kernels derived from diagonalization of transmission cross coefficients of the lithographic process and for which minimum image log slope is maximized in the image at each of the fragmentation points,
where the (a) illumination points, (b) the mask configuration, and/or (c) information derived from (a) and/or (b), is configured to design, control and/or modify the physical lithographic process involving the pattern and/ or design, control and/or modify a physical object or apparatus to be used in the physical lithographic process.

* * * * *

UNITED STATES PATENT AND TRADEMARK OFFICE
CERTIFICATE OF CORRECTION

PATENT NO. : 10,657,641 B2
APPLICATION NO. : 14/281539
DATED : May 19, 2020
INVENTOR(S) : Robert Socha It is certified that error appears in the above-identified patent and that said Letters Patent is hereby corrected as shown below:

On page 2, item (56) References Cited
Please add "US 6,563,566 May 13, 2003 Rosenbluth et al." in U.S. Patent Documents.

Signed and Sealed this
Twenty-eighth Day of July, 2020

Andrei Iancu
*Director of the United States Patent and Trademark Office*